(12) United States Patent
Lue

(10) Patent No.: US 7,636,257 B2
(45) Date of Patent: Dec. 22, 2009

(54) METHODS OF OPERATING P-CHANNEL NON-VOLATILE MEMORY DEVICES

(75) Inventor: Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 793 days.

(21) Appl. No.: 11/417,939

(22) Filed: May 4, 2006

(65) Prior Publication Data
US 2006/0281260 A1 Dec. 14, 2006

Related U.S. Application Data

(60) Provisional application No. 60/689,767, filed on Jun. 10, 2005.

(51) Int. Cl.
*G11C 11/34* (2006.01)
(52) U.S. Cl. ............... 365/185.18; 365/185.05; 365/185.28
(58) Field of Classification Search ............ 365/185.05, 365/185.28; 265/185.18; 257/395
See application file for complete search history.

(56) References Cited

U.S. PATENT DOCUMENTS

| 5,286,994 | A | 2/1994 | Ozawa et al. |
|---|---|---|---|
| 5,319,229 | A | 6/1994 | Shimoji et al. |
| 5,952,692 | A | 9/1999 | Nakazato et al. |
| 6,005,809 | A | 12/1999 | Sung et al. |
| 6,011,725 | A | 1/2000 | Eitan et al. |
| 6,026,026 | A | 2/2000 | Chan et al. |
| 6,074,917 | A | 6/2000 | Chang et al. |
| 6,169,693 | B1 | 1/2001 | Chan et al. |
| 6,218,700 | B1 | 4/2001 | Papadas |
| 6,512,696 | B1 | 1/2003 | Fan et al. |
| 6,671,209 | B2 | 12/2003 | Lin et al. |
| 6,680,505 | B2 | 1/2004 | Ohba et al. |
| 6,709,928 | B1 | 3/2004 | Jenne et al. |
| 6,720,630 | B2 | 4/2004 | Mandelman et al. |
| 6,784,480 | B2 | 8/2004 | Bhattacharyya |

(Continued)

FOREIGN PATENT DOCUMENTS

CN 1606165 4/2005

(Continued)

OTHER PUBLICATIONS

Search Report mailed Feb. 14, 2007 in European Application No. 06000093.2 filed on Jan. 3, 2006, 7 pages.

(Continued)

*Primary Examiner*—Son Dinh
(74) *Attorney, Agent, or Firm*—Kenta Suzue; Haynes Beffel & Wolfeld LLP

(57) ABSTRACT

Methods of operating non-volatile memory devices are described. The memory devices comprise memory cells having an n-type semiconductor substrate and p-type source and drain regions disposed below a surface of the substrate and separated by a channel region. A tunneling dielectric layer is disposed above the channel region. A charge storage layer is disposed above the tunneling dielectric layer. An upper insulating layer is disposed above the charge storage layer, and a gate is disposed above the upper insulating multi-layer structure. A positive bias is applied to a word lines of the memory device in a selected memory cell and a negative bias is applied to a bit line in the selected cell.

15 Claims, 26 Drawing Sheets

U.S. PATENT DOCUMENTS

| | | | |
|---|---|---|---|
| 6,818,558 B1 | 11/2004 | Rathor et al. | |
| 6,897,533 B1 | 5/2005 | Yang et al. | |
| 6,903,968 B2 * | 6/2005 | Jeng | 365/185.03 |
| 6,912,163 B2 | 6/2005 | Zheng et al. | |
| 6,942,320 B2 | 9/2005 | Chung et al. | |
| 7,075,828 B2 | 7/2006 | Lue et al. | |
| 7,115,469 B1 | 10/2006 | Halliyal et al. | |
| 7,115,942 B2 | 10/2006 | Wang | |
| 7,133,313 B2 | 11/2006 | Shih et al. | |
| 7,151,692 B2 | 12/2006 | Wu et al. | |
| 7,164,603 B2 | 1/2007 | Shih et al. | |
| 7,190,614 B2 | 3/2007 | Wu et al. | |
| 7,209,390 B2 | 4/2007 | Lue et al. | |
| 7,391,652 B2 | 6/2008 | Lue et al. | |
| 2003/0030100 A1 | 2/2003 | Lee et al. | |
| 2003/0032242 A1 | 2/2003 | Lee et al. | |
| 2003/0042534 A1 | 3/2003 | Bhattacharyya | |
| 2003/0117855 A1 | 6/2003 | Lee | |
| 2003/0146465 A1 | 8/2003 | Wu | |
| 2003/0224564 A1 | 12/2003 | Kang et al. | |
| 2004/0079983 A1 | 4/2004 | Chae et al. | |
| 2004/0183126 A1 | 9/2004 | Bae et al. | |
| 2004/0251489 A1 | 12/2004 | Jeon et al. | |
| 2005/0006696 A1 | 1/2005 | Noguchi et al. | |
| 2005/0023603 A1 | 2/2005 | Eldridge et al. | |
| 2005/0074937 A1 | 4/2005 | Jung | |
| 2005/0093054 A1 | 5/2005 | Jung | |
| 2005/0219906 A1 | 10/2005 | Wu | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0270849 A1 | 12/2005 | Lue | |
| 2005/0281085 A1 | 12/2005 | Wu | |
| 2006/0118858 A1 | 6/2006 | Jeon et al. | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202261 A1 | 9/2006 | Lue et al. | |
| 2006/0258090 A1 | 11/2006 | Bhattacharyya et al. | |
| 2006/0261401 A1 | 11/2006 | Bhattacharyya | |
| 2006/0281260 A1 | 12/2006 | Lue | |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0045718 A1 | 3/2007 | Bhattacharyya | |
| 2007/0069283 A1 | 3/2007 | Shih et al. | |
| 2007/0120179 A1 | 5/2007 | Park et al. | |
| 2009/0039417 A1 | 2/2009 | Chen et al. | |

FOREIGN PATENT DOCUMENTS

| | | |
|---|---|---|
| EP | 0016246 | 10/1980 |
| EP | 1411555 | 4/2004 |
| EP | 01677311 | 7/2006 |
| EP | 01677312 | 7/2006 |
| JP | 2004 363329 | 12/2004 |

OTHER PUBLICATIONS

Search Report mailed Nov. 14, 2007 in European Application No. 06000064.3 filed on Jan. 3, 2006, 4 pages.

Search Report mailed May 9, 2008 in European Application No. 06000093.2 filed on Jan. 3, 2006, 4 pages.

Lue, Hang-Ting, File History of U.S. Appl. No. 12/121,791, filed May 16, 2008, 69 pages.

Search Report mailed Feb. 14, 2007 in European Application No. 06000064.3 filed on Jan. 3, 2006, 7 pages.

Search Report mailed May 9, 2008 in European Application No. 06000064.3 filed on Jan. 3, 2006, 3 pages.

White et al., "On the Go with SONOS" IEEE Circuits and Devices, Jul. 2000, 22-31.

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Ito et al., "A Novel MNOS Techology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., " A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Yeh, C.C., et al., "Phines: a Novel Low Power Program/Erase, Small Pitch, 2-Bit per Cell Flash Memory," IEDM Tech Digest 2002, 931-934.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.

Baik, Seung, et al., "High Speed and Nonvolatile Si Nanocrystal Memory for Scaled Flash Technology using Highly Field-Sensitive Tunnel Barrier," IEEE IEDM 03-545, 22.3.1-22.3.4.

Lee, Chang, et al., "A Novel SONOS Structure of SiO2/SiN/Al2O3 with TaN Metal Gate for Multi-Giga Bit Flash Memeries," IEEE 2003, 4 pages.

Lue et al., "A Novel P-Channel NAND-Type Flash memory with 2-bit/cell Operation and High Programming Throughput (>20 MB/sec)," IEEE 2005, 4 pages.

Tsai et al., " Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Cho et al., "Simultaneous Hot-Hole Injection at Drain and Source for Efficient Erase and Excellent Endurance in SONOS Flash EEPROM Cells," IEEE Electron Device Letters, vol. 24 No. 4, Apr. 2003, pp. 260-262.

Shih et al., "A Novel 2-bit/cell Nitride Storage Flash memory with Greater than 1M P/E-cycle Endurance," IEEE 2004, pp. 36.3.1-36.3.4, IEDM 04-881 to 884.

Blomme et al., "Multilayer tunneling barriers for nonvolatile memory applications," Device Research Conference, 2002. 60th DRC. Conference Digest, 2002, 153-4.

Blomme et al., Write/Erase Cycling Endurance of Memory Cells With SiO2/HfO2 Tunnel Dielectric, IEEE Transactions on Device and Materials Reliability, vol. 4, No. 3, Sep. 2004, pp. 345-351.

Govoreanu, et al., "Variot: A Novel Multilayer Tunnel Barrier Concept for Low-Voltage Nonvolatile Memory Devices," IEEE Electron Device Letters, vol. 24, No. 2, Feb. 2003, pp. 94-101.

Govoreanu et al., "Simulation of Nanofloating Gate Memory with High-k Stacked Dielectrics," IEEE 2003, pp. 299-302, SISPAD Intl. Conf. Sep. 3-5, 2003.

Govoreanu et al., "An Investigation of the Electron Tunneling Leakage Current through Ultrathin Oxides/High-k Gate Stacks at Inversion Conditions," IEEE 2003, pp. 287-290, SISPAD Intl. Conf. Sep. 3-5, 2003.

Kim et al., "Robust Multi-bit Programmable Flash Memory Using a Resonant Tunnel Barrier," Electron Devices Meeting, Dec. 5-7, 2005, IEDM Technical Digest, pp. 861-864.

Likharev, "Layered tunnel barriers for nonvolatile memory devices," Applied Physics Letters, vol. 73, No. 15, Oct. 1998, pp. 2137-2139.

Lue et al., "BE-SONOS: A Bandgap Engineering SONOS with Excellent Performance and Reliability," IEDM Tech. Digest. IEEE Intl., Dec. 2005, 547-550.

Sung et al., "Multi-Layer SONOS with Direct Tunnel Oxide for High Speed and Long Retention Time," IEEE 2002 Silicon Nanoelectronics Workshop, Jun. 2002, pp. 83-84.

Aminzadeh et al., "Conduction and Charge Trapping in Polysilicon-Silicon Nitride-Oxide-Silicon Structures under Positive Gate Bias," IEEE Transactions on Electron Devices . . . vol. 35, No. 4, Apr. 1998, pp. 459-467.

Yamada et al., "A self-convergence erasing scheme for a simple stacked gate flash EEPROM," Proceedings of the International Electron Devices Meeting, IEEE, Dec. 1991, 307-310.

\* cited by examiner

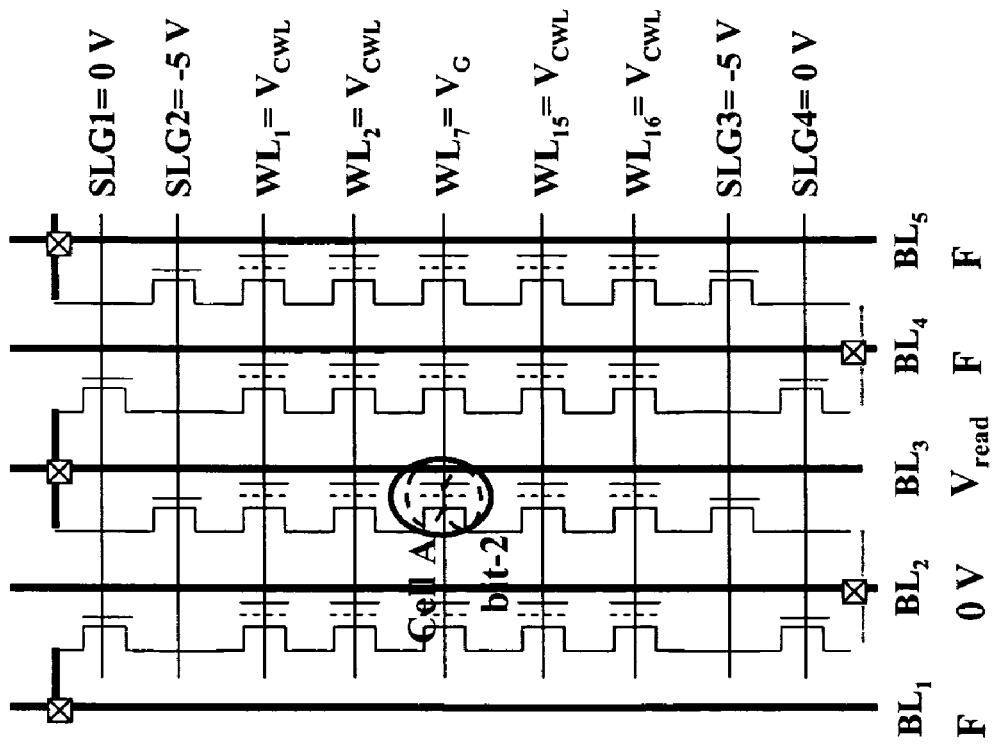
Fig. 12b — Reading Bit-2 of Cell-A
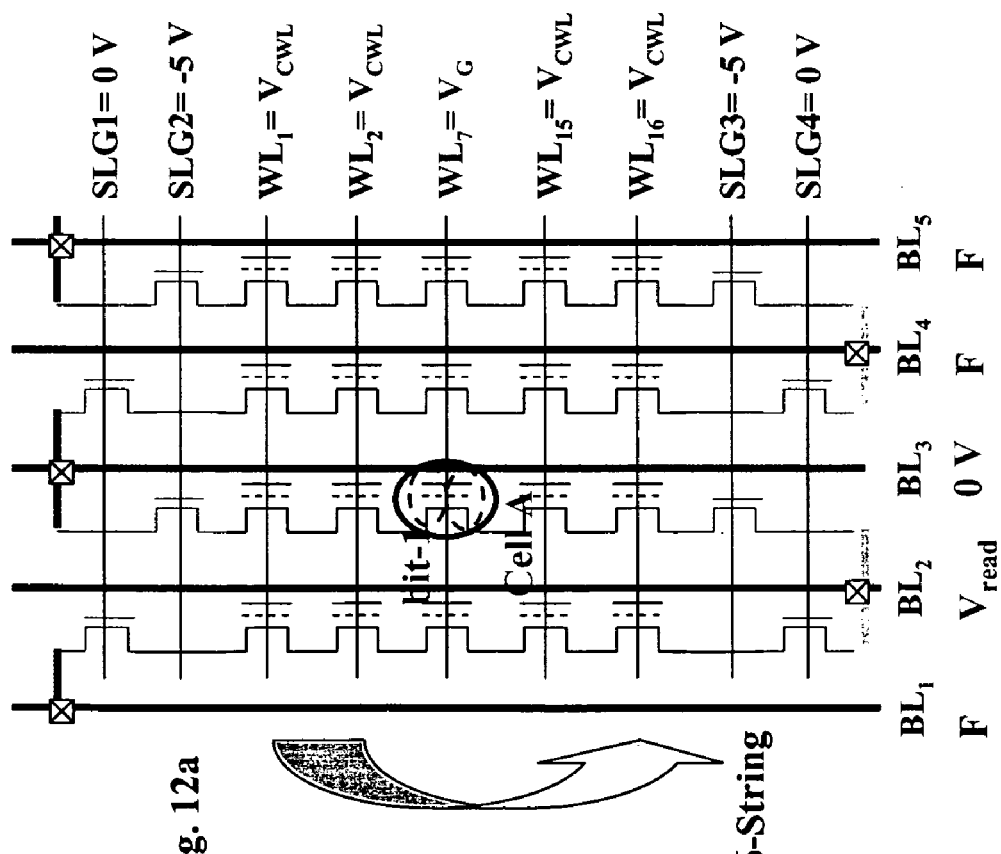
Fig. 12a — Reading Bit-1 of Cell-A
16-String

METHODS OF OPERATING P-CHANNEL NON-VOLATILE MEMORY DEVICES

CROSS REFERENCE TO RELATED APPLICATIONS

This application is based upon and claims the benefit of, under 35 U.S.C. § 119(e), U.S. Provisional Patent Application No. 60/689,767, filed on Jun. 10, 2005, the entire contents of which is incorporated herein by reference.

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

A flash memory device generally includes an array of memory cells arranged in rows and columns. Each memory cell includes a MOS transistor structure having a gate, a drain, a source, and a channel defined between the drain and the source. The gate corresponds to a word line, and the drain or source corresponds to a bit line of the memory array. The gate of a conventional flash memory cell is generally a dual-gate structure, including a control gate and a floating gate, wherein the floating gate is sandwiched between two dielectric layers to trap carriers such as electrons, to "program" the cell. In other words, in a conventional cell, a first dielectric layer is formed over the channel, the floating gate is formed over the first dielectric layer, a second dielectric layer is formed over the floating gate, and the control gate is finally formed over the second dielectric layer.

During programming, a set of programming biases are applied to selected word lines and bit lines. One or more memory cells corresponding to the selected word lines and bit lines are biased in the programming state. For a single memory cell, different biases applied to the source and drain thereof create an electric field along the channel thereof, through which electrons gain enough energy to tunnel through the first dielectric layer into the floating gate and become stored therein. As a result of the stored electrons in the floating gate, the threshold voltage of the memory cell is modified. The changing of the threshold voltage determines whether the memory cell is programmed.

To read a memory cell, reading biases are applied and a sensing device reads a current passing through the memory cell. If a memory cell is programmed, or has electrons stored in its floating gate, its current level is different from those memory cells which are not programmed. Therefore, based on the measured current level, the sensing device is capable of determining the state of each memory cell.

To erase the information stored in a flash memory cell, erasing biases are applied thereto to force the stored electrons to funnel out the floating gate, through a known mechanism referred to as Fowler-Nordheim (F-N) tunneling.

However, certain problems are associated with conventional flash memory, such as, for example, high power consumption and program and read disturbances. High power consumption is due to high program and erasure voltages required to induce electron tunneling for program and erase operations. Program and read disturbances relate to current leakage occurring at non-selected neighboring memory cells.

A disturbance occurs when one selected cell in the memory array is being read or programmed and another non-selected programmed memory cell sharing the same word line or bit line experiences current leakage caused by electron tunneling of the selected cell. A loss of electrons stored in the floating gate of the non-selected memory cell may result in a change of status from "programmed" to "erased". The read disturbance is further explained with reference to FIG. 1, which shows a flash memory array comprising conventional floating gate memory cells.

Thus there is a need in the art for memory cell designs and devices containing arrays of such memory cells which can be operated via methods which avoid the aforementioned problems.

BRIEF SUMMARY OF THE INVENTION

The present invention relates, in general, to memory devices, and more particularly, to non-volatile memory devices which can employ band-to-band tunneling induced hot electron injection programming methods.

The present invention includes methods of operating a memory device, wherein the memory device includes a substrate having n-type conductivity and a plurality of memory cells formed thereon, each memory cell including a control gate, a source region, a drain region, a channel region defined between the source and drain regions, a charge-storage layer provided above the channel region, a multi-layer tunneling dielectric structure provided between the charge-storage layer and the channel region, and an insulating layer provided between the charge-storage layer and the control gate, wherein the source region and the drain region each have p-type conductivity, and wherein the control gate corresponds to a word line, the source region corresponds to a first bit line, and the drain region corresponds to a second bit line. Non-volatile memory cells which can be operated in accordance with the methods of the present invention wherein the charge-storage layer comprises a charge-trapping material provide each memory cell with a first bit portion and a second bit portion each for storing one bit of information.

One embodiment of the present invention includes a method of programming a p-channel memory cell of the present invention by applying a positive bias to the word line of the memory cell, applying a negative bias to a bit line of the memory cell, and applying a ground bias to another bit line of the memory cell. In certain preferred embodiments, a negative bias can be applied to one or more other word lines in an array during a programming operation to reduce potential program disturb effects.

Additional embodiments of the present invention include methods of operating memory cells and devices, wherein a reset/erase operation is carried out prior to or subsequent to programming. A reset/erase operation can be carried out by applying a negative bias to the word line of the selected memory cell and applying a ground bias to both the first bit line and the second bit line. In certain preferred embodiments of the present invention, a plurality of memory cells are reset or erased by applying a negative bias to two or more word lines in selected memory cells and applying a ground bias to the bit lines in each of the selected cells.

Memory devices which can be operated in accordance with the methods of the present invention can include a semiconductor substrate, a plurality of discontinuous bit lines formed in the substrate, wherein each discontinuous bit line includes a plurality of diffusion regions spaced apart from each other, a multi-layer tunneling dielectric structure formed on the substrate, a charge-trapping layer formed on the multi-layer tunneling dielectric structure, an insulating layer formed on the charge-trapping layer, and a plurality of word lines formed over the insulating layer. The plurality of word lines and the plurality of bit lines along with the tunneling dielectric structure, the charge-trapping layer and the insulating layer define a plurality of memory cells, each memory cell corresponding to an intersection of a word line and two adjacent diffusion regions of one of the plurality of discontinuous bit lines. Each memory cell includes a transistor formed by one of the plurality of the word lines, two adjacent diffusion regions of one of the plurality of discontinuous bit lines, and the tunneling dielectric layer, the charge-trapping layer and the insulating layer disposed there between.

In accordance with the present invention, there is also provided an operation method for a memory device, wherein the memory device includes a semiconductor substrate, a plurality of discontinuous bit lines formed in the substrate, wherein each discontinuous bit line includes a plurality of diffusion regions spaced apart from each other, a multi-layer tunneling dielectric structure formed on the substrate, a charge-trapping layer formed on the multi-layer tunneling dielectric structure, an insulating layer formed on the charge-trapping layer, and a plurality of word lines formed over the insulating layer. The plurality of word lines and the plurality bit lines along with the tunneling dielectric layer, the charge-trapping layer and the insulating layer define a plurality of memory cells, each memory cell corresponding to one word line and two adjacent diffusion regions of one of the plurality of discontinuous bit lines, and wherein each discontinuous bit line has a first end and a second end. The operation method includes selecting a memory cell by applying a turn-on voltage to all of the plurality of word lines except the word line of the selected memory cell and applying a ground bias to both the first and the second end of all of the plurality of discontinuous bit lines except the discontinuous bit line of the selected memory cell, and operating the selected memory cell.

Memory devices which can be operated in accordance with the methods of the present invention also include arrays formed in an n-type substrate, and having a first p-type diffusion region formed in the substrate corresponding to a first bit line, a second p-type diffusion region formed in the substrate corresponding to a second bit line, a channel region defined as a part of the substrate between the first p-type diffusion region and the second p-type diffusion region, a multi-layer tunneling dielectric structure formed above the channel region, a charge-trapping layer formed on the multi-layer tunneling dielectric structure, an insulating layer formed on the charge-trapping layer, and a control gate formed over the insulating layer corresponding to a word line. The charge-trapping layer includes a first part for storing a first bit of information and a second part for storing a second bit of information.

Memory devices operable in accordance with the methods of the present invention also include memory devices comprising a semiconductor substrate, a plurality of bit lines each including a diffusion region formed in the substrate, a multi-layer tunneling dielectric structure formed over the substrate, a charge-trapping layer formed over the multilayer tunneling dielectric structure, an insulating layer formed over the charge-trapping layer, and a plurality of word lines formed over the insulating layer. The plurality of word lines and the plurality of bit lines define a plurality of memory cells, each memory cell corresponding to one word line and two adjacent bit lines, and wherein each memory cell includes a transistor formed by the corresponding word line and the corresponding two adjacent bit lines.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

The present invention includes methods of operating p-channel non-volatile memory cells and devices which comprise a plurality of such memory cells (i.e., an array). As used herein, the term "plurality" and the phrase "at least two" synonymously refer to two or more of the element to which the term or phrase refers. Additionally, as used herein, the singular indefinite articles "a" and "an", and the definite article "the" include plural references unless the context clearly dictates otherwise. Thus, for example, reference to "a memory cell" can include a plurality of such memory cells.

In certain preferred embodiments, the multilayer tunneling dielectric structure can include a layer comprising a material having a small hole tunneling barrier height, wherein the material is present in the layer at a concentration gradient such that the concentration of the material is at a maximum at a depth point within the layer. As used herein, the phrase "small hole tunneling barrier height" refers generally to values which are less than the approximate hole tunneling barrier height of silicon dioxide. In particular, a small hole tunneling barrier height is preferably less than about 4.5 eV. More preferably, a small hole tunneling barrier height is less than about 1.9 eV.

It is to be understood that both the foregoing general description and the following detailed description are exemplary and explanatory only and are not restrictive of the invention, as claimed.

BRIEF DESCRIPTION OF THE SEVERAL
VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 12a and 12b are equivalent circuit diagrams of a NAND array architecture under read biases in accordance with an embodiment of the present invention;

DETAILED DESCRIPTION OF THE INVENTION

Reference will now be made in detail to the invention and the presently preferred embodiments thereof, examples of which are illustrated in the accompanying drawings. It should be noted that the non-graph drawings are in greatly simplified form and are not to precise scale. Wherever possible, the same reference numbers will be used throughout the drawings to refer to the same or like parts. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that are known in the art or to be developed.

According to the present invention, there is provided a p-channel NVM device which can utilize a programming method comprising band-to-band tunneling induced hot electron injection (BTBTHE). The memory device may comprise a memory array including a matrix of p-channel memory cells. Memory arrays comprising p-channel NVM cells in NAND architectures operated in accordance with the methods of the present invention can provide flash memory applications with very high programming throughput (e.g., >20 MB/sec).

Figure 1:
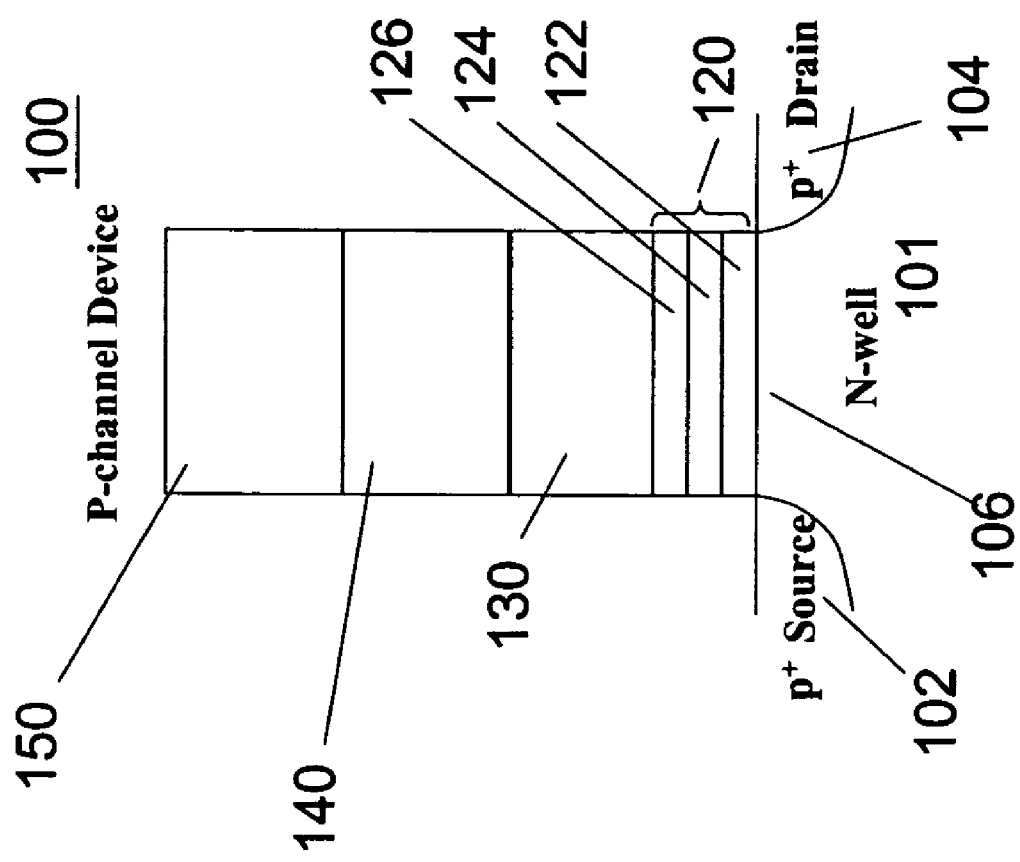
FIG. 1 is a cross-sectional schematic representation of a p-channel memory cell operable in accordance with various embodiments of the present invention.

FIG. 1 depicts a cell structure of an exemplary memory cell 100 in accordance with a preferred embodiment of the present invention. Referring to FIG. 1, there is provided a semiconductor substrate 101 with two diffusion regions 102 and 104 formed therein. Semiconductor substrate 101 may comprise any conventional semiconductor material, such as silicon. The substrate 101 has n-type conductivity, and diffusion regions 102 and 104 have p-type conductivity. A multi-layer stack is formed over a channel region 106 formed in semiconductor substrate 101 between diffusion regions 102 and 104. The multi-layer stack includes a multi-layer tunneling dielectric structure 120, a charge-storage layer 130, an insulating layer 140, and a control gate 150. The multi-layer tunneling dielectric structure can preferably comprise an ultra-thin ONO structure comprising a first tunneling oxide layer 122, a small hole-tunneling-barrier height layer 124, and a second tunneling dielectric 126. The charge-storage layer 130 can preferably comprise a charge-trapping material such as, for example, silicon nitride, and the insulating layer 140 can preferably comprise silicon dioxide. The control gate 150 may comprise polycrystalline silicon, a metal, metal silicide, or a combination thereof. Memory device 100 comprises a p-type MOS transistor, with a diffusion regions 102 and 104 serving as the source/drain regions thereof.

A memory cell in accordance with the present invention comprises a semiconductor substrate. Any substrate material suitable for use in semiconductor devices may be used. In many preferred embodiments of the present invention, the semiconductor substrate comprises a silicon material. Silicon wafers prepared via standard techniques can be used to prepare a suitable substrate. For example, suitable wafers can be prepared via a process wherein silicon is grown from a small crystal, called the seed crystal, rotated and slowly withdrawn from a molten hyper-pure silicon to give a cylindrical crystal, which is then sliced to obtain thin disks, which after slicing, are finely ground, mirror-smooth polished and cleaned. Thus, for example, in FIG. 1, substrate 101 can comprise a silicon wafer.

In accordance with the present invention, the semiconductor substrate comprises n-type silicon. Generally, n-type silicon substrates capable of use in accordance with preferred embodiments of the present invention include silicon wafers which have been lightly n-doped. In the present invention wherein the source/drain regions comprise p+ doped implantation regions, a lightly n-doped substrate can be advantageous in programming and reading of the memory cell due to the reverse bias of the PN junctions. N-type doping of a semiconductor substrate such as silicon can be carried out in any suitable manner, such as, via an implantation of, for example, arsenic, phosphorous, nitrogen or any other free-electron element capable of use in semiconductor materials. Preferably, the n-type doping is carried out at a dosage level of from about $10^{13}/cm^3$ to about $10^{16}/cm^3$. More preferably, the n-type doping is carried out at a dosage level of from about $10^{14}/cm^3$ to about $10^{15}/cm^3$.

The multi-layer tunneling dielectric layer preferably comprises a layer having a small hole-tunneling barrier height. As used herein, materials having a small hole-tunneling barrier height refer to suitable dielectric materials that when under an electric field are capable of allowing tunneling, but when unbiased, prevent direct tunneling, and can be deposited thin enough to not serve as a charge-trapping layer itself. In certain preferred embodiments of the present invention, the multi-layer tunneling dielectric comprises an ONO structure having layer thicknesses of 15/20/18 angstroms, respectively.

In certain preferred embodiments of the present invention, control gate 118 corresponds to a word line of a memory array, and source 104 and drain 106 (or alternatively, source 106 and drain 104) correspond to bit lines of the memory array. Therefore, each memory cell has a corresponding word line and pair of corresponding bit lines, or a first bit line and a second bit line. In certain more preferred embodiments of the present invention, control gate 118 corresponds to a word line of a memory array, and source 104 and drain 106 (or alternatively, source 106 and drain 104) correspond to two adjacent diffusion regions of a discontinuous bit line in the array.

It is to be understood that a MOS structure is generally symmetrical and the source and drain are interchangeable in functionality. Therefore, in the above and following descriptions and in any embodiment of the present invention, the source and drain of a memory cell, or the first and second bit lines of an array, may be interchanged without affecting the functionality of the cell or array or the scope of the present invention. In other words, a particular diffusion region may function as either a source or drain in a given cell depending upon the applied voltages, as understood by those of ordinary skill in the art.

Memory cells in accordance with the present invention include: a multilayer tunneling dielectric structure, which can include a first silicon oxide layer O1, a first silicon nitride layer N1, and a second silicon oxide layer O2; a charge-storage layer, such as a second silicon nitride layer N2; and an insulating layer such as a third silicon oxide layer O3, on or over ("above") a substrate, such as a semiconductor substrate (e.g., a silicon substrate). The tunneling dielectric structure allows hole tunneling from the substrate to the charge-storage layer during an erase/reset operation of the memory device. Preferably, the tunnel dielectric structure in a non-volatile memory cell of the present invention has a negligible charge-trapping efficiency, and more preferably, does not trap charge at all during memory operations.

Charge storage materials such as a silicon nitride layer, $HfO_2$, and $Al_2O_3$ may be used as the small hole tunneling barrier height layer in a tunnel dielectric structure. In certain preferred embodiments of the present invention, an efficient charge storage material, such as a silicon nitride can be used as a charge storage layer in the memory device. A blocking oxide that prevents charge loss may serve as an insulating layer, such as a third silicon oxide layer O3. The memory cells according to the present invention also include a gate or gate electrode, such as a polysilicon gate, above the insulating layer. The tunnel dielectric structure, charge storage layer, insulating layer and gate can be formed above the substrate above at least a portion of a channel region, which is defined by and is disposed between a source region and a drain region.

Memory cells according to various embodiments of the present invention comprise a tunnel dielectric structure which can provide fast FN erase speeds of around 10 msec under a negative gate voltage (Vg), such as a Vg of about −10 to about −20 V. On the other hand, the charge retention can still be maintained, and, in some examples, may be better than many conventional SONOS devices. Memory cells according to the present invention can also avoid the use of band-to-band hot hole erase operations, which, are commonly used in NROM devices. Avoidance of such band-to-band hot hole erase operations may greatly eliminate hot-hole introduced damages and such avoidance is therefore desirable.

A tunneling dielectric structure may include two or more layers, including one layer that may provide a small hole-tunneling-barrier height. In one example, the layer providing a small hole-tunneling-barrier height may contain silicon nitride. The layer may be sandwiched between two silicon oxide layers, thereby forming an O/N/O tunnel dielectric if silicon nitride is used as the intermediate layer. In certain preferred embodiments of the present invention, each layer in a tunnel dielectric structure is up to about 4 nm thick. In some preferred embodiments, each of the layers in the tunnel dielectric structure can have a thickness of about 1 nm to 3 nm. In one exemplary device, a tri-layer structure may have a bottom layer, such as a silicon oxide layer, of about 10 Å to 30 Å, an intermediate layer, such as a silicon nitride layer, of about 10 Å to 30 Å, and a top layer, such as another silicon oxide layer, of about 10 Å to 30 Å. In one particular example, an O/N/O tri-layer structure having a 15 Å bottom silicon oxide layer, a 20 Å intermediate silicon nitride layer, and an 18 Å top silicon oxide layer may be used.

A thin O/N/O tri-layer structure shows negligible charge trapping when operated in accordance with various embodiments of the present invention. Theoretical band diagram and tunneling current analysis suggests that a tunnel dielectric structure, such as an O1/N1/O2 structure having thicknesses of 3 nm or less for each of the layers, can suppress the hole direct-tunneling at low electric field during retention. At the same time, it still may allow efficient hole tunneling at high electric field. This may be because the band offset can effectively screen out the tunneling barrier of N1 and O2. Therefore, a device in accordance with the present invention may offer fast hole tunneling erase, while it is immune from the retention problem of the conventional SONOS devices. Experimental analysis shows excellent endurance and retention properties of memory cells in accordance with various embodiments of the present invention.

In certain preferred embodiments, the tunnel dielectric structure includes at least a middle layer and two adjacent layers on opposing sides of the middle layer, wherein each of the middle layer and two adjacent layers comprises a first material and a second material, wherein the second material has a valence band energy level greater than the valence band energy level of the first material and the second material has a conduction band energy level less than the conduction band energy level of the first material; and wherein the concentration of the second material is higher in the middle layer than in the two adjacent layers and the concentration of the first material is higher in the two adjacent layers than in the middle layer. Preferably, in a tunnel dielectric structure in accordance with this embodiment of the present invention, the first material comprises oxygen and/or an oxygen-containing compound and the second material comprises nitrogen and/or a nitrogen-containing compound. For example, the first material can comprise an oxide, such as silicon oxide, and the second material can comprise a nitride, such as $Si_3N_4$ or $Si_xO_yN_z$.

Tunnel dielectrics in accordance with this aspect of the invention may be comprised of three or more layers, all of which can contain similar elements (such as Si, N and O), so long as the concentration of the material having the smallest hole tunneling barrier height is higher within the middle layer than in the two adjacent layers.

In certain tunnel dielectric structures according to the preceding embodiment of the present invention, the second material can be present in the middle layer in a gradient concentration such that the concentration of the second material in the middle layer increases from one adjacent layer/middle layer interface to a maximum concentration at a depth point within the middle layer, and decreases from the maximum concentration depth point to a lower concentration at the other adjacent layer/middle layer interface. The increase and decrease in concentration is preferably gradual.

In still other embodiments of the present invention, the tunnel dielectric structure includes at least a middle layer and two adjacent layers on opposing sides of the middle layer, wherein the two adjacent layers comprise a first material and the middle layer comprises a second material, wherein the second material has a valence band energy level greater than the valence band energy level of the first material and the second material has a conduction band energy level less than the conduction band energy level of the first material; and wherein the second material is present in the middle layer in a gradient concentration such that the concentration of the second material in the middle layer increases from one adjacent layer/middle layer interface to a maximum concentration at a depth point within the middle layer, and decreases from the maximum concentration depth point to a lower concentration at the other adjacent layer/middle layer interface. The increase and decrease in concentration is preferably gradual. Preferably, in a tunnel dielectric structure in accordance with this embodiment of the present invention, the first material comprises oxygen and/or an oxygen-containing compound and the second material comprises nitrogen and/or a nitrogen-containing compound. For example, the first material can comprise an oxide, such as silicon oxide, and the second material can comprise a nitride, such as $Si_3N_4$ or $Si_xO_yN_z$.

For example, in embodiments of the present invention where the tunnel dielectric layer comprises a tri-layer ONO structure, the bottom oxide and top oxide layers can comprise silicon dioxide and the middle layer can be comprised of, for example, silicon oxynitride and silicon nitride wherein the concentration of silicon nitride (i.e., the material having the smaller hole tunneling barrier height of the two) is not constant within the layer, but rather reaches a maximum at some depth point within the layer between the two interfaces with the sandwiching oxide layers.

The precise point within the middle layer where the material with the smallest hole tunneling barrier height reaches its maximum concentration is not critical, so long as it is present in a gradient and reaches its maximum concentration in the tunnel dielectric layer at some point within the middle layer.

The gradient concentration of the material having the smallest hole tunneling barrier height can be advantageous in improving various properties of non-volatile memory devices, particularly those having a SONONOS, or SONONOS-like structure. For example, retention state charge loss can be diminished, hole tunneling under high electric fields can be improved and, to the extent it may occur, charge-trapping in the tunnel dielectric can be avoided.

The band diagram of a tunneling dielectric structure can be advantageously modified in accordance with this aspect of the present invention such that the valence band energy level and the conduction band energy level of the middle layer do not have a constant value, but rather vary across the thickness of the layer with the concentration of the material having the smallest hole tunneling barrier height.

Multi-layer tunneling dielectric structures in accordance with such embodiments of the present invention, can be prepared in a variety of ways. For example, a first silicon dioxide or silicon oxynitride layer can be formed using any number of conventional oxidation approaches including, but not limited to thermal oxidation, radical (ISSG) oxidation, and plasma oxidation/nitridation, as well as chemical vapor deposition processes. A middle layer with a gradient concentration of SiN can then be formed, for example, via chemical vapor deposition processes, or alternatively, by plasma nitridation of excess oxide or oxynitride formed on top of the first layer. A third layer, the upper oxide layer, can then be formed, for example, by oxidation or chemical vapor deposition.

A charge storage layer can then be formed over the tunnel dielectric structure. In one example, a charge storage layer of about 5 nm to 10 nm may be formed over the tunnel dielectric structure. In one particular example, a silicon nitride layer of about 7 nm or thicker may be used. The insulating layer above the charge storage layer may be about 5 nm to 12 nm. For example, a silicon oxide layer of about 9 nm or thicker may be used. And the silicon oxide layer may be formed by a thermal process converting at least a portion of a nitride layer to form the silicon oxide layer. Any method, known or to be developed, for forming layers of suitable materials described herein can be used to deposit or form tunnel dielectric layers, charge-storage layers and/or insulating layers. Suitable methods include, for example, thermal growth methods and chemical vapor deposition methods.

In one example, a thermal conversion process may provide a high density or concentration of interfacial traps that can enhance the trapping efficiency of a memory device. For example, thermal conversion of nitride can be carried out at 1000° C., while the gate flow ratio is H2:O2=1000:4000 sccm.

In addition, because silicon nitride generally has very low (about 1.9 eV) hole barrier, it may become transparent to hole tunneling under high field. Meanwhile, the total thickness of a tunnel dielectric, such as an ONO structure, may prevent direct tunneling of electrons under a low electric field. In one example, this asymmetrical behavior may provide a memory device offering not only fast hole-tunneling erase, but also reduction or elimination of charge leakage during retention.

An exemplary device may be fabricated by 0.12 μm NROM/NBit technologies. Table 1 shows the device structure and parameters in one example. The tunnel dielectric with an ultra-thin OINIO may alter the hole tunneling current. A thicker (7 nm) N2 layer may serve as a charge-trapping layer and an O3(9 nm) layer may serve as the blocking layer in one example. Both N2 and O3 may be fabricated using NROM/NBit technologies.

TABLE 1

| Layer | Approximate Thickness (Angstroms) |
|---|---|
| Bottom Oxide (O1) | 15 |
| Inter Nitride (N1) | 20 |
| Inter Oxide (O2) | 18 |
| Trapping Nitride (N2) | 70 |
| Blocking Oxide (O3) | 90 |

Gate: N+ - polysilicon
Channel length: 0.18 μm
Channel width: 0.18 μm

In certain embodiments of the present invention, a gate can comprise a material having a work function greater than that of $N^+$ polysilicon. In certain preferred embodiments of the present invention, such a high work function gate material can comprise a metal such as, for example, platinum, iridium, tungsten, and other noble metals. Preferably, the gate material in such embodiments has a work function greater than or equal to about 4.5 eV. In particularly preferred embodiments, the gate material comprises a high work function metal such as, for example, platinum or iridium. Additionally, preferred high work function materials include, but are not limited to P+ polysilicon, and metal nitrides such as, for example, titanium nitride and tantalum nitride. In particularly preferred embodiments of the present invention, the gate material comprises platinum.

An exemplary device in accordance with an embodiment of the present invention having a high work function gate material may also be fabricated by 0.12 μm NROM/NBit technologies. Table 2 shows the device structure and parameters in one example. The tunnel dielectric with an ultra-thin O/N/O may alter the hole tunneling current. A thicker (7 nm) N2 layer may serve as a charge-trapping layer and an O3 (9 nm) layer may serve as the blocking layer in one example. Both N2 and O3 may be fabricated using NROM/NBit technologies.

TABLE 2

| Layer | Approximate Thickness (Angstroms) |
|---|---|
| Bottom Oxide | 15 |
| Inter Nitride | 20 |
| Inter Oxide | 18 |
| Trapping Nitride (N2) | 70 |
| Blocking Oxide | 90 |

Gate: Platinum
Channel length: 0.18 μm
Channel width: 0.18 μm

Memory cells in accordance with high work function gate material embodiments of the present invention exhibit erase properties which are even more improved over other embodiments. High work function gate materials suppress gate electron injection into the trapping layer. In certain embodiments of the present invention wherein the memory cells comprise an N+ polysilicon gate, hole tunneling into the charge-trapping layer during erase occurs simultaneously with gate electron injection. This self-converging erase effect results in higher threshold voltage levels in the erased state, which can be undesirable in NAND applications. Memory cells in accordance with high work function gate material embodiments of the present invention can be used in various type of memory applications including, for example, NOR- and NAND-type memories. However, the memory cells according to high work function gate material embodiments of the present invention are particularly suitable for use in NAND applications where elevated threshold voltages in the erased/reset state can be undesirable. Memory cells in accordance with high work function gate material embodiments of the present invention can be erased via hole tunneling methods and preferably via-FN erasing operations.

Because charge-trapping layer 130 is non-conductive, when carriers tunnel into charge-trapping layer 130, the carriers are trapped therein and become relatively immobile. By controlling the biases on control gate 150, source 102, and drain 104, it is possible to control into which part of charge-trapping layer 130 the carriers tunnel. Therefore, charge-trapping layer 130 may be divided into two parts, a first bit and a second bit, each for the storage of one bit of information. In one aspect, the first bit corresponds to the part of charge-trapping layer 130 adjacent to the first bit line, or source 102, and the second bit corresponds to the part of charge-trapping layer 130 adjacent to the second bit line, or drain 104. By controlling the part of charge-trapping layer 130 into which the carriers tunnel, the first bit and the second bit may be respectively programmed, read, or erased. Since the source and drain of a MOS structure are generally interchangeable, the programming or reading method for the first bit of memory cell 100 may also be applied to program or read the second bit. Therefore, only the method for the first bit is described herein.

Figure 2:
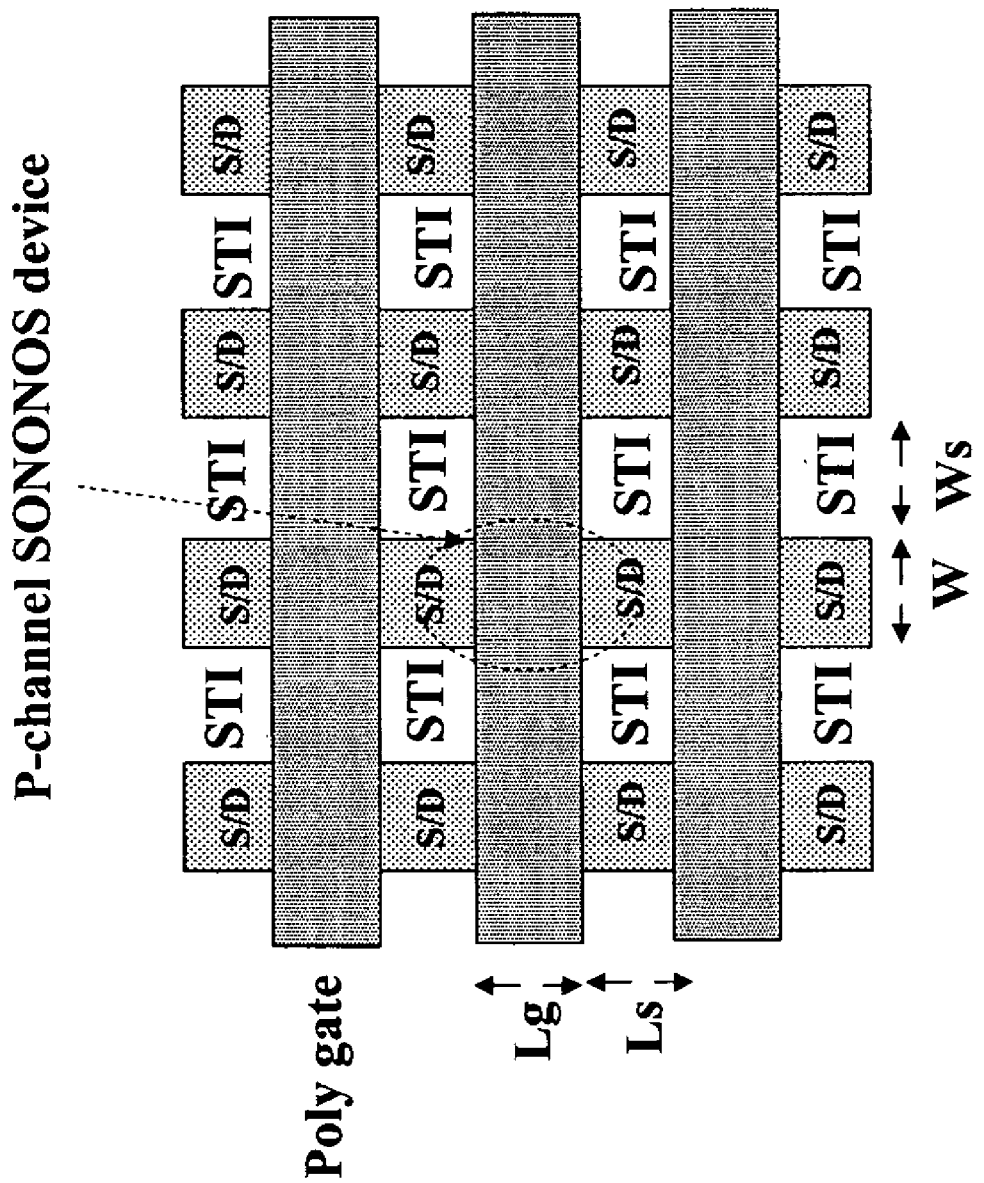
FIG. 2 is a representation of a NAND array architecture operable in accordance with an embodiment of the present invention.
Figure 3:
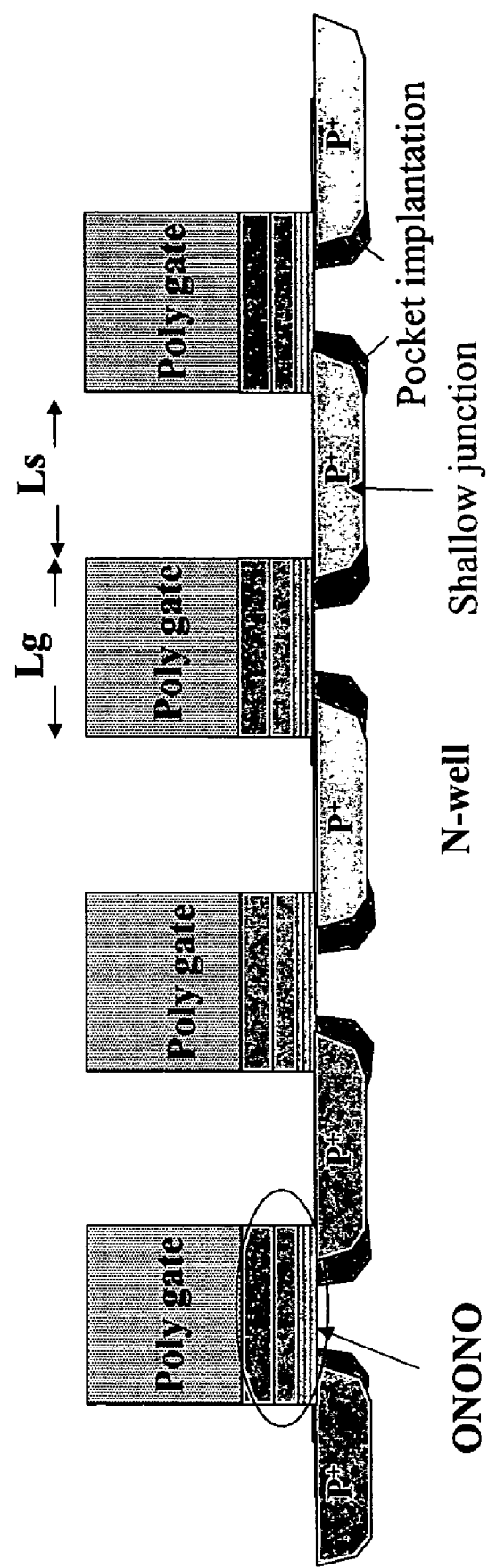
FIG. 3 is a cross-sectional schematic representation of the NAND array architecture depicted in FIG. 2 in the channel length direction.
Figure 4:
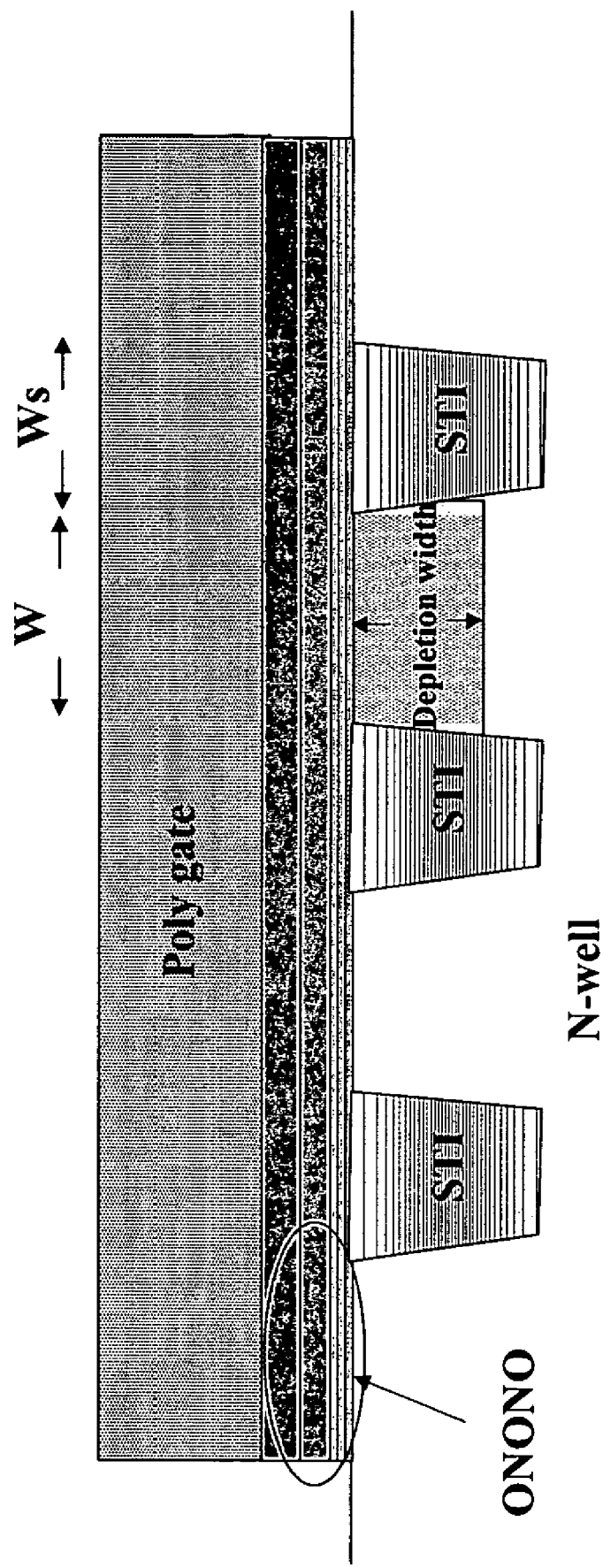
FIG. 4 is a cross-sectional schematic representation of the NAND array architecture depicted in FIG. 2 in the channel width direction.

Exemplary memory arrays in accordance with preferred embodiments of the present invention are represented schematically in FIGS. 2, 3 and 4. FIG. 2 depicts an array structure having discontinuous bit lines (vertical) comprising a plurality of diffusion regions (S/D), which may function as sources or drains, and a plurality of word lines (horizontal). The diffusion regions are formed in the substrate and the areas of the substrate below the word lines and between two adjacent diffusion regions in the same discontinuous bit line define a plurality of channel regions. Lg represents the channel length. Ls is the space between each memory cell. W is the channel width and Ws is the width of the shallow 20 trench isolations (STI) which help to separate the transistor fields from one another. The trench depth of the shallow trench isolations is preferably larger than the depletion width in the p-well during programming. Suitable trench depths can be about 100 to 400 nm. FIG. 3 is a cross-sectional schematic view of a portion of the array depicted in FIG. 2, taken along a line in the direction of the channel length. FIG. 4 is a cross-sectional schematic view of a portion of the array depicted in FIG. 2, taken along a line in the direction of the channel width.

Figure 5:
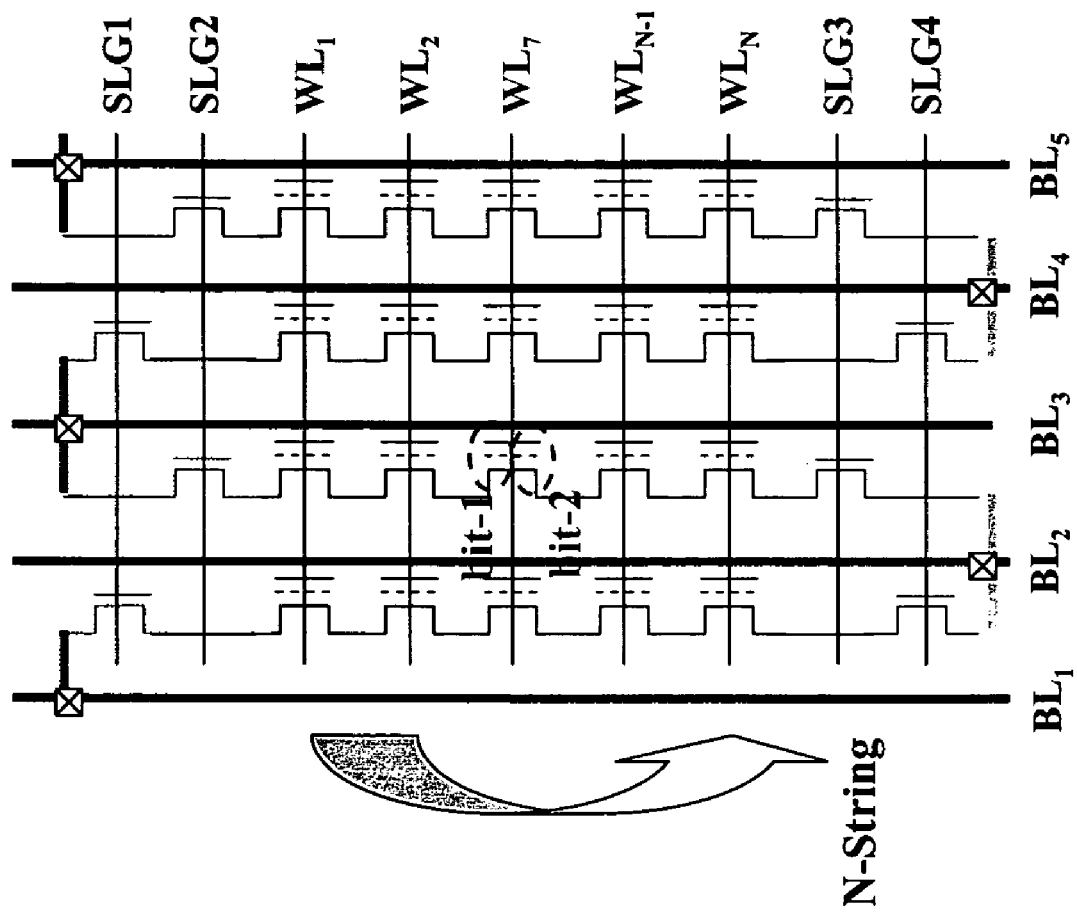
FIG. 5 is an equivalent circuit diagram of a NAND array architecture in accordance with an embodiment of the present invention.

FIG. 5 depicts an equivalent circuit diagram of a memory array in accordance with one preferred embodiment of the present invention. The intersection of each word line (WL) with two adjacent bit lines (BL's) comprises a transistor, and each transistor comprises a two-bit cell, wherein a first bit, "bit-1" can be stored separately from a second bit, "bit-2". As shown in FIG. 5, the memory cell comprising Bit-1 and Bit-2 is formed by $BL_2$, $BL_3$ and $WL_7$.

The operations of memory cell arrays in accordance with various embodiments of the present invention are next explained with reference to FIGS. 6, 7, 8a, 8b, 9, 10, 11, 12a, 12b, 13a, 13b, 14, 15, 16 and 17.

Figure 6:
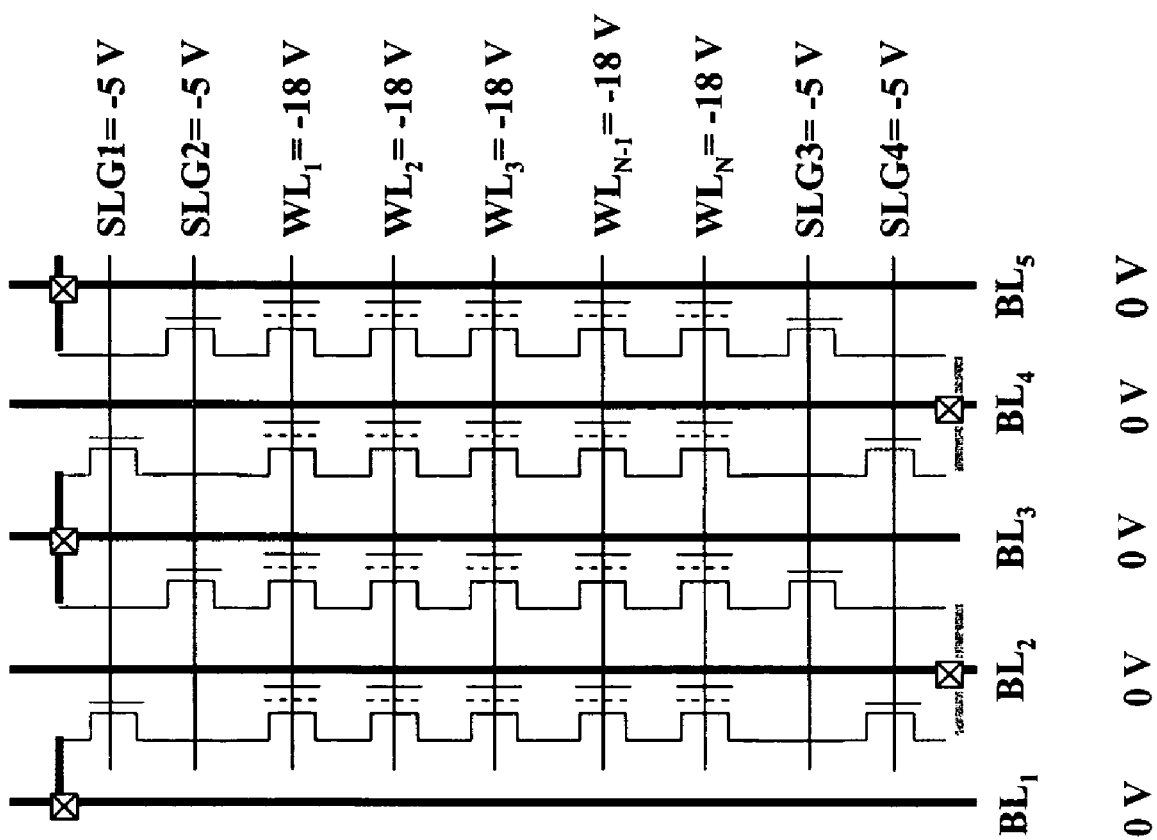
FIG. 6 is an equivalent circuit diagram of a NAND array architecture under reset/erase biases in accordance with an embodiment of the present invention.

Referring to FIG. 6, a memory cell array in accordance with a preferred embodiment of the present invention is first reset (i.e., all cells erased) by applying a first set of biases thereto. Specifically, each word line (WL) is biased at a high negative voltage of about −12V to about −20V, and preferably about −18V, and each bit line (BL) is grounded. Select transistors (SLG's) which may optionally be present in conjunction with the memory array are also negatively biased, or switched on. Thus, a strong vertical electric field is created below the word lines (WL's), each of which corresponds to a gate in a row of memory cells. Under the strong electric field, two tunneling processes take place simultaneously. In the first process, electrons tunnel from the gate, through the insulating layer, into the charge-trapping layer. In the second process, holes tunnel from the channel, through the multi-layer ONO tunneling dielectric layer, into the charge-trapping layer. A dynamic balance may be reached between the two tunneling processes, which is defined as the reset state of the memory cell. In accordance with various embodiments of the present invention, at the dynamic balance after reset, the concentration of electrons in the charge-trapping layer is such that a threshold voltage, $V_{th}$, of memory device can be positive or negative. In those embodiments wherein the $V_{th}$ is positive, the memory device is turned on as long at $V_g-V_d<V_{th}$ or $V_g-V_s<V_{th}$, wherein $V_g$ is the bias at control gate, $V_d$ is the bias at drain, and $V_s$ is the bias at source, and the memory device is a depletion mode MOS transistor at the reset state. In certain other preferred embodiments, the gate is selected from materials having a high work function, preferably greater than about 4.5 eV, such as platinum. The use of such gate materials is helpful in limiting gate electron injection, and thus, lower erase state threshold voltages can be obtained.

Figure 7:
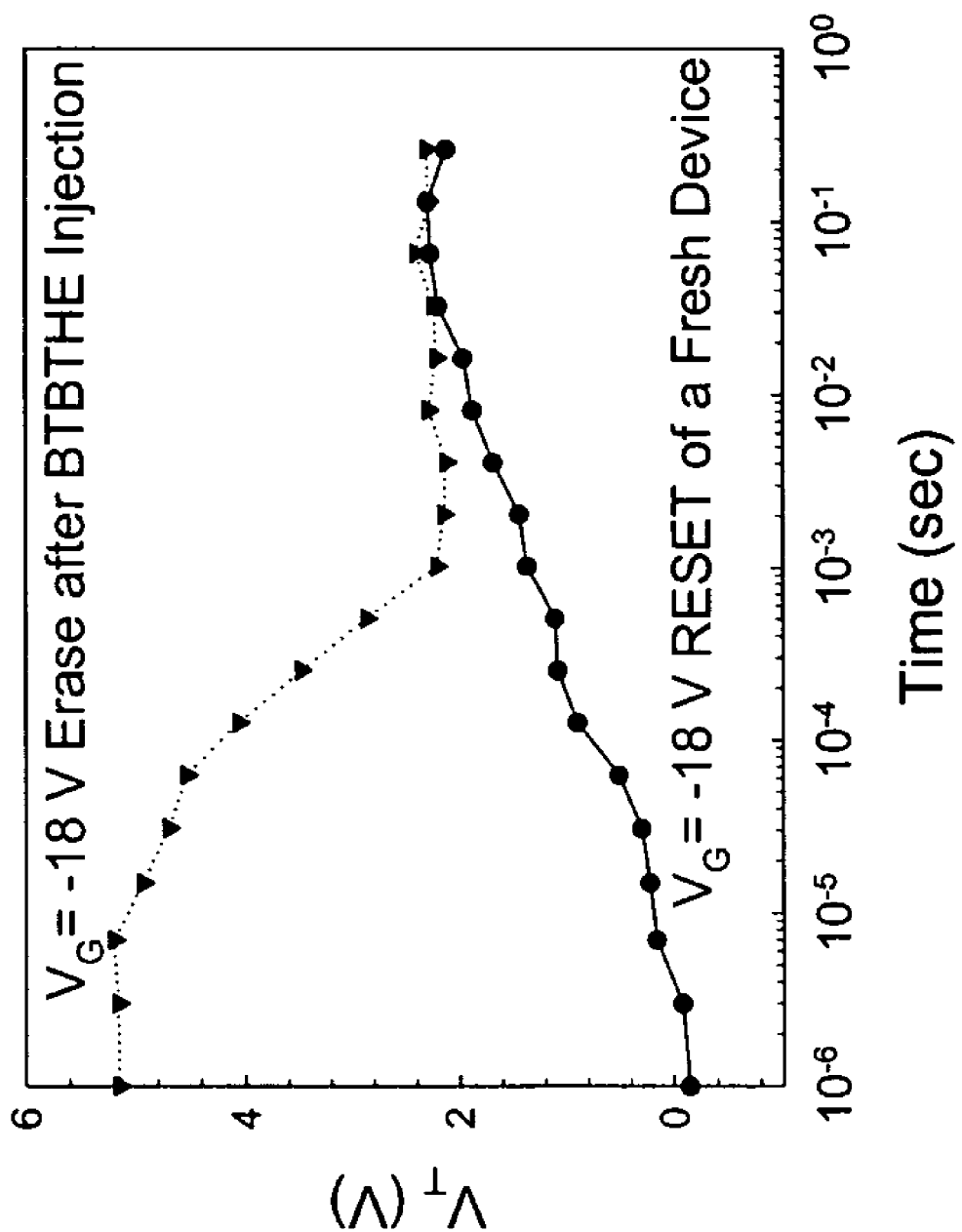
FIG. 7 is a graphical representation of erase state threshold voltage as a function of erase time.

FIG. 7 depicts the typical threshold voltage properties of a memory device in accordance with an embodiment of the present invention wherein the gate comprises polysilicon, as a function of erase time. As shown in FIG. 7, the threshold voltage of the device reaches a dynamic balance. The reset state is the point where the two curves approach one another. As shown in FIG. 7, the time for the reset operation required to reach the reset state in the example device represented by FIG. 7 is approximately 10 msec.

Figure 8A:
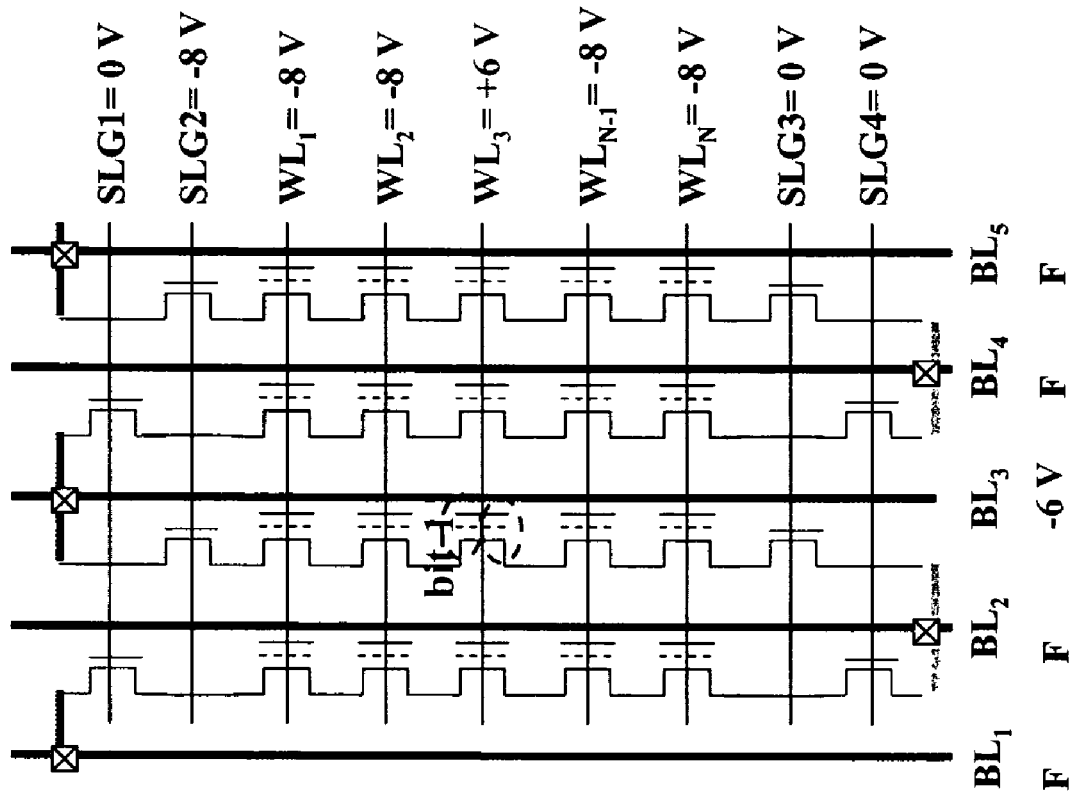
FIGS. 8a and 8b are equivalent circuit diagrams of a NAND array architecture under programming biases in accordance with an embodiment of the present invention.

Referring to FIG. 8a, the first bit of memory cell A is programmed by applying a second set of biases to the device to cause band-to-band tunneling hot electron injection ("BBHE" or "BTBTHE"). The word line associated with the cell to be programmed, $WL_3$ in FIG. 8a, is biased at a positive voltage, e.g., 5-8 V, and the first bit line of memory cell A is biased at a negative voltage, e.g., −5 to −8 V, and both the second bit line of memory cell A, and substrate are grounded. All other word lines are negatively biased and any optionally present select transistors are turned on as applicable, such as $SLG_2$ in FIG. 8a. In general, the negative bias applied to the bit line and the positive voltage applied to the word line can have a difference of from about 8V to about 15V. Thus, the junction between source and substrate is reversely biased, creating a deep depletion region therebetween. Due to the deep depletion region and, therefore, a strong electric field across the junction, electrons tunnel from the valence band on the side of source to the conduction band on the side of substrate, and are accelerated by an electric field created by the biases at the first and second bit lines along channel region. As the electrons are accelerated along channel region and attain high energy, the vertical electric field due to the positive control bias applied to the word line (i.e., gate) "pulls" some of the electrons out of channel region and the electrons are injected into charge-trapping layer. In other words, electrons tunnel through the multi-layer tunneling dielectric layer into the charge-trapping layer. Since the electrons gain most of their energy in the neighborhood of the source, or the first bit line, they tunnel into the part of the charge-trapping layer that is adjacent to the first bit line. Therefore, in that part of the charge-trapping layer, the distribution profile of the electrons is modified such that the density of the electrons is higher. Programming currents for BTBTHE are typically small, such as, for example, about 10 nA. Programming times are short. In general, programming time of about 30 μsec or less can be used.

Figure 8B:
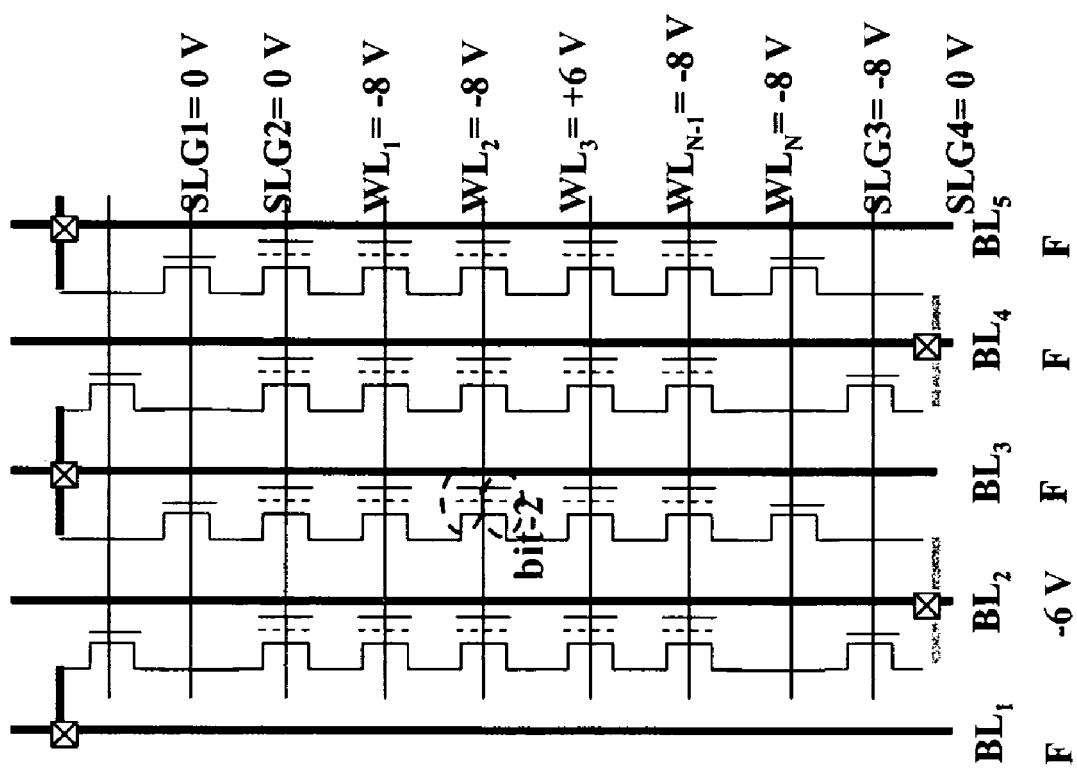

Referring to FIG. 8b, Bit-2 of memory cell A is programmed similarly by applying a positive bias to the word line, $WL_3$, and a negative bias to the second bit line, $BL_2$ in this example. All other word lines are negatively biased and any optionally present select transistors are turned on as applicable, such as $SLG_3$ in FIG. 8b.

Figure 9:
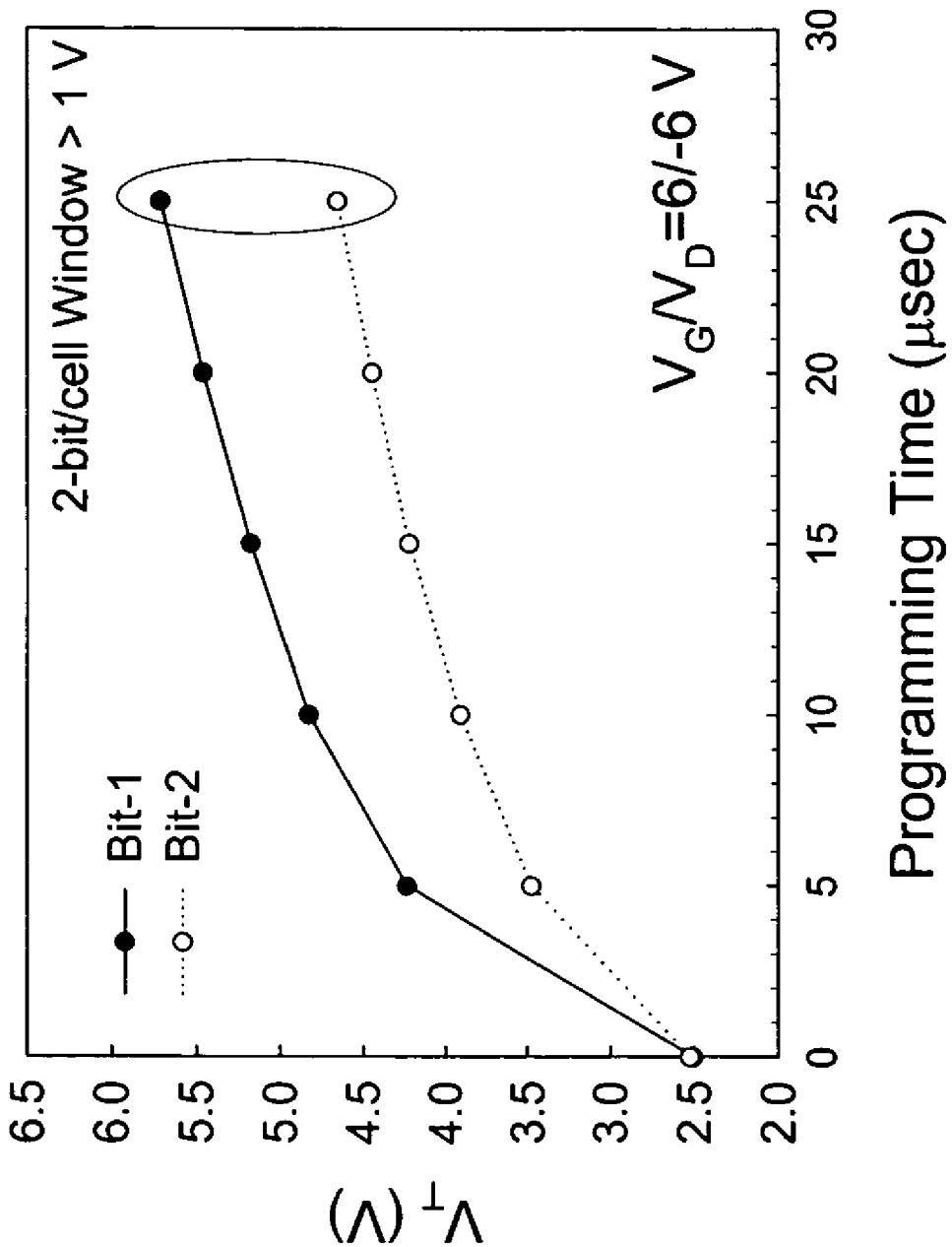
FIG. 9 is a graphical representation of the threshold voltage of the two bits of a single cell after programming.

Referring to FIG. 9, a two-bit per memory cell window having a value of greater than 1 V is achieved through the programming aspects of the present invention. In preferred embodiments wherein $V_g/V_D$=6/−6 V, the threshold voltage differential between bit 1 and bit 2 is at least 1 V.

Figure 10:
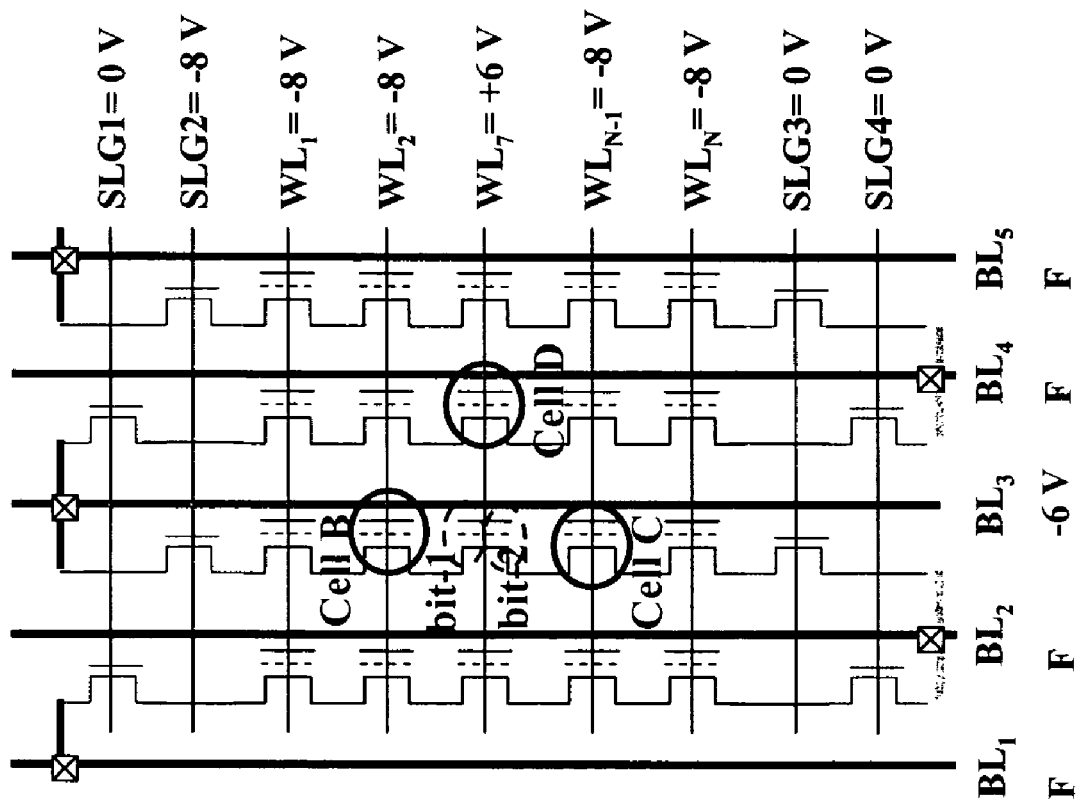
FIG. 10 is an equivalent circuit diagram of a NAND array architecture in accordance with an embodiment of the present invention highlighting adjacent cells.
Figure 11:
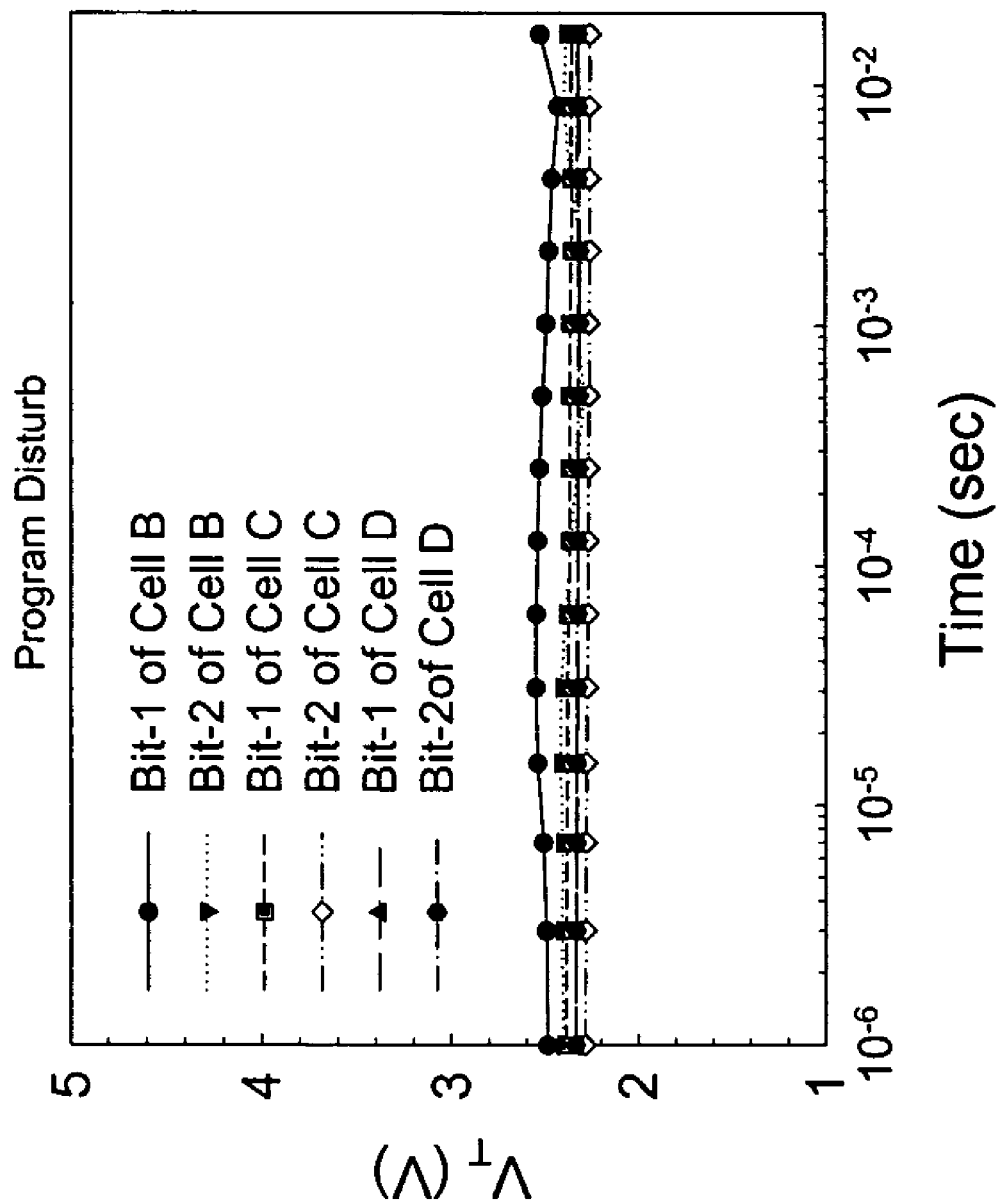
FIG. 11 is a graph showing limited programming disturb characteristics of devices/operations in accordance with one embodiment of the present invention.

Adjacent cells are minimally, if at all, disturbed when programming a neighboring cell. Referring to FIGS. 10 and 11, for example, when programming bit-1 or bit-2 of Cell A, the threshold voltage of Cell B, Cell C and Cell D are hardly affected. The threshold voltages of the adjacent cells as a function of time are shown in FIG. 11.

Referring to FIGS. 12a and 12b, to read the first bit of memory cell A, a third set of biases is applied to the device. Reading of the memory cells in accordance with the present invention is preferably carried out using reverse read methods. Specifically, the word line corresponding to the memory cell, $WL_7$ in FIG. 12a, is biased at a voltage, e.g., 1V, between the erased state level (EV) and the programmed state level (PV). All other wordlines are pass gates during reading and are thus biased at $V_{CWL}$. As reverse read is employed, the first bit line is grounded, and a negative voltage of from about −1 to about −2.5 V is applied to the second bit line, and preferably a negative voltage of about −2V, as shown in FIG. 12a. A sensing circuit (not shown) external to the memory cell then senses the current passing through the channel due to the bias difference between source and drain. In one aspect, the difference between the bias at the control gate and the bias at the source is between $V_{th1}$ and $V_{th}$, i.e., $V_{th}<V_g-V_s<V_{th1}$. Thus, the first bit will be turned on if it is programmed, and will be turned off if it is in the reset state. By sensing the current passing through memory call A, it may be determined whether the first bit is programmed or not. Referring to FIG. 12b, reading of bit-2 of memory cell A is carried out similarly wherein the second bit line is grounded and the first bitline is negatively biased.

Figure 13B:
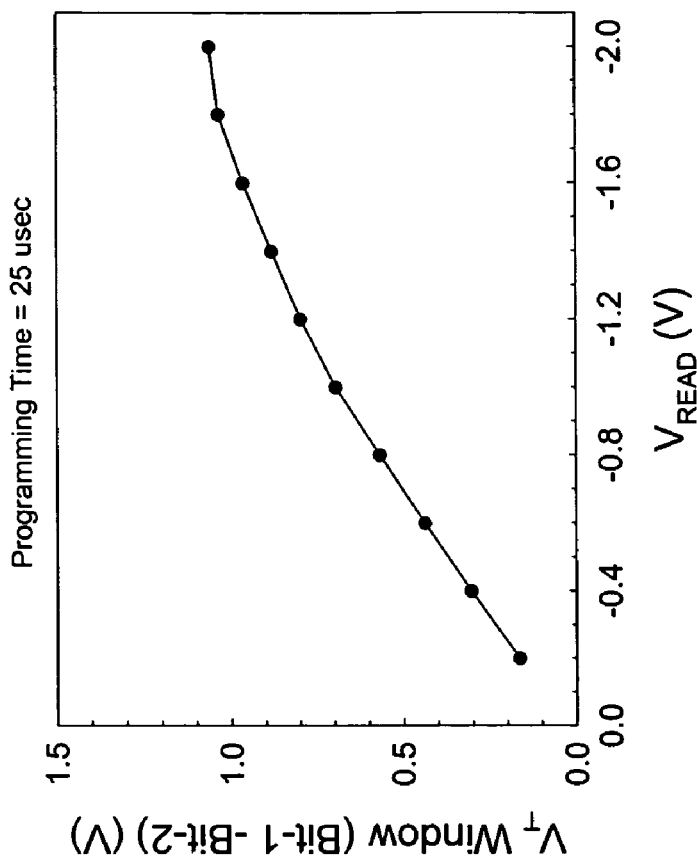
FIGS. 13a and 13b are graphical representations of the threshold voltage windows of 2-bit/cell as a function of read voltage.
Figure 13A:
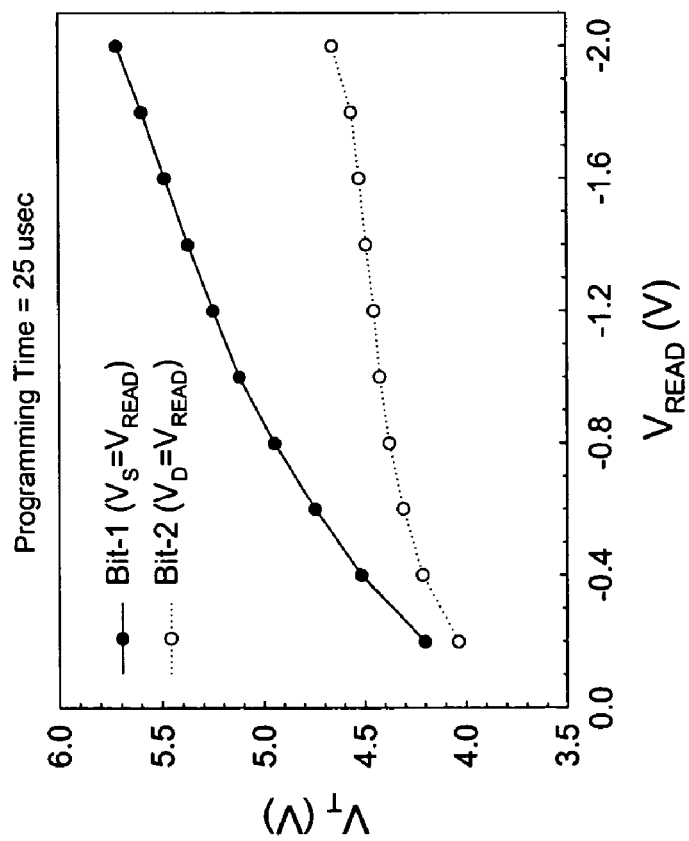

Devices and methods in accordance with certain preferred embodiments of the present invention perform better and exhibit increased memory windows between the two bits of a cell when larger read voltages are employed. Referring to FIG. 13a, as the difference between the threshold voltages of bit-1 and bit-1 as a function of read voltage increases, the more negative the read voltage becomes. As shown in FIG. 13b, the threshold voltage difference is approximately 1.0 V at a read voltage of −2.0 V.

Figures 14, 15:
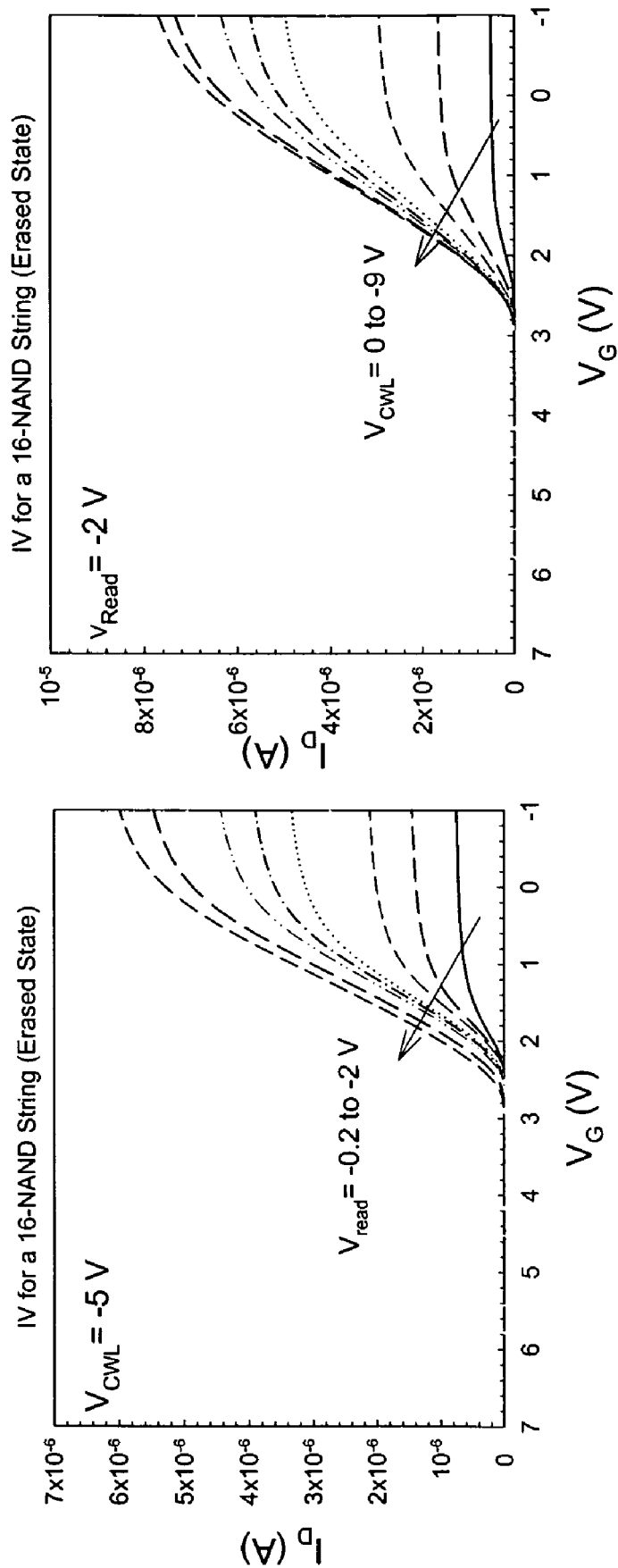
FIGS. 14 and 15 are graphical current-voltages (IV) analyses of devices in accordance with the rules.

Read currents for the devices of the present invention were evaluated and are suitable for flash applications. After a device in accordance with one embodiment of the present invention is reset to Vt=2.5V, various read voltages and $V_{CWL}$ were used to read the NAND string. Larger read voltages and larger $V_{CWL}$ achieve larger read currents. Referring to FIG. 14 and FIG. 15, it is shown that a zero $V_{CWL}$ obtains a 0.5 μA read current, a $V_{CWL}$=−5 V and a read voltage of −2 V obtains a 2 μA current.

Figure 17:
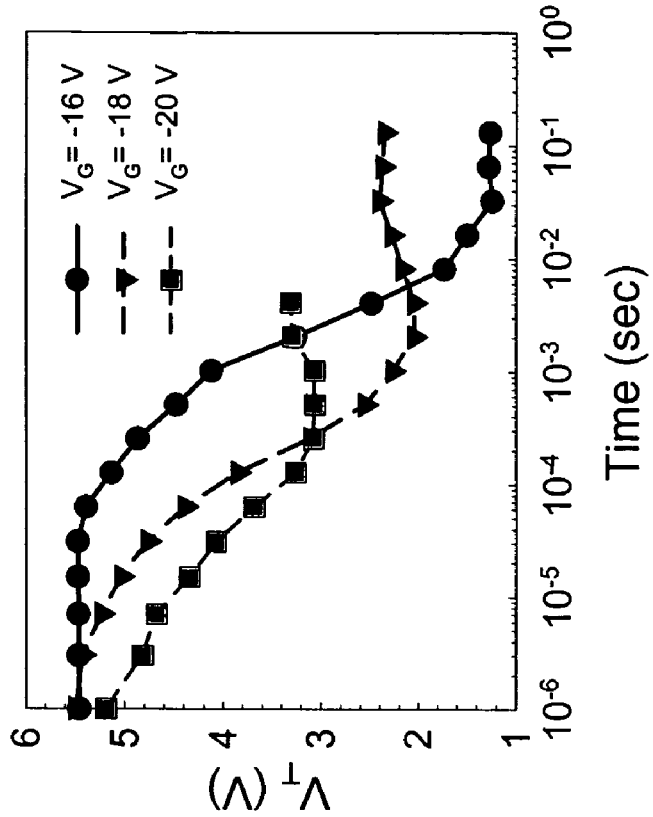
FIG. 17 is a graphical representation of the erase state threshold voltage as a function of time at three different gate voltages.
Figure 16:
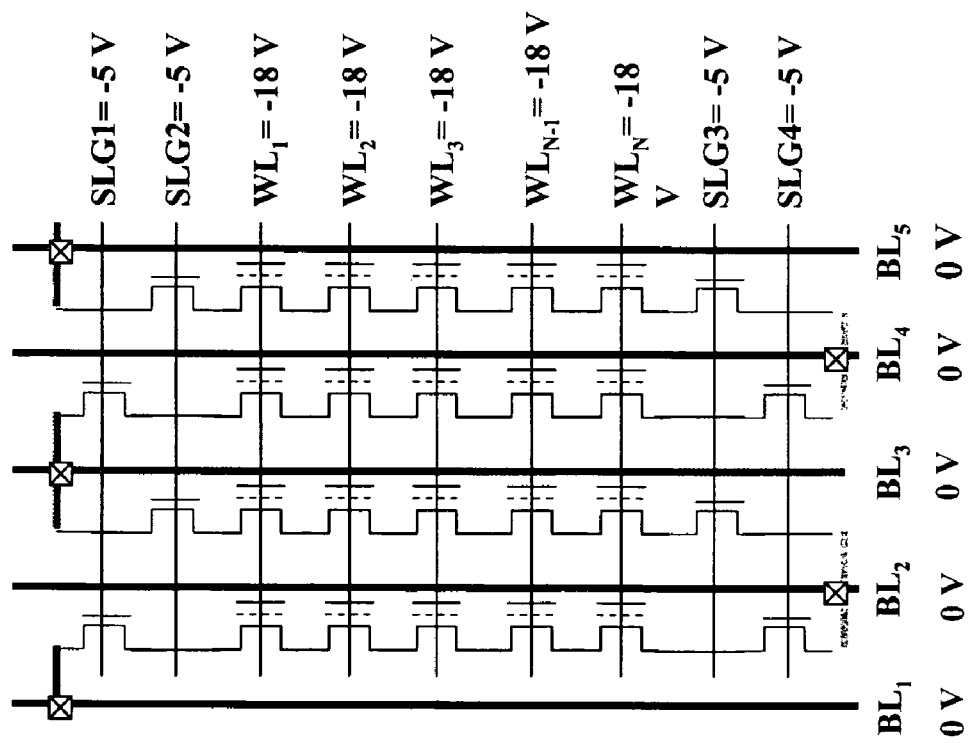
FIG. 16 is an equivalent circuit diagram of a NAND array architecture after reset/erase in accordance with an embodiment of the present invention.

Erasing the memory devices according to the present invention is carried out in virtually the same manner as the reset operation described hereinabove, although the erase times are faster than reset. Referring to FIGS. 16 and 17, wordline erase biases of −18 V provide erasing in well under 10 msec. FIG. 17 depicts the threshold voltage on erase as a function of time at three different gate voltages.

Figure 18:
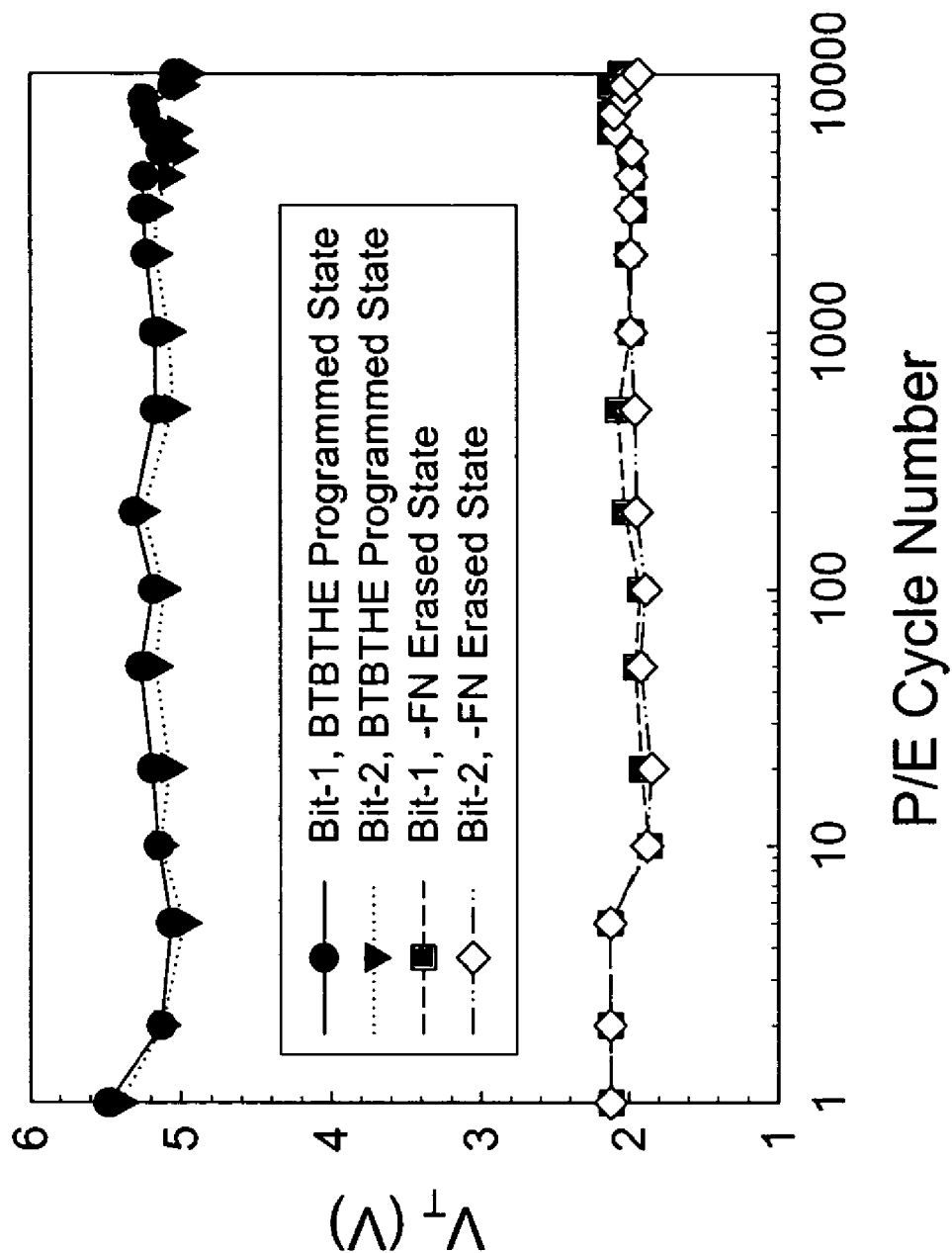
FIG. 18 is a graphical representation of program/erase cycle characteristics of a device in accordance with one embodiment of the present invention.

The devices in accordance with the present invention also exhibit excellent program/erase cycle endurance. Referring to FIG. 18, the threshold voltage of two bits in both the programmed state and the erased state at initial reset and throughout 10,000 P/E cycles is graphed. As shown in FIG. 18, the threshold voltages did not vary significantly over 10,000 cycles.

Figure 19:
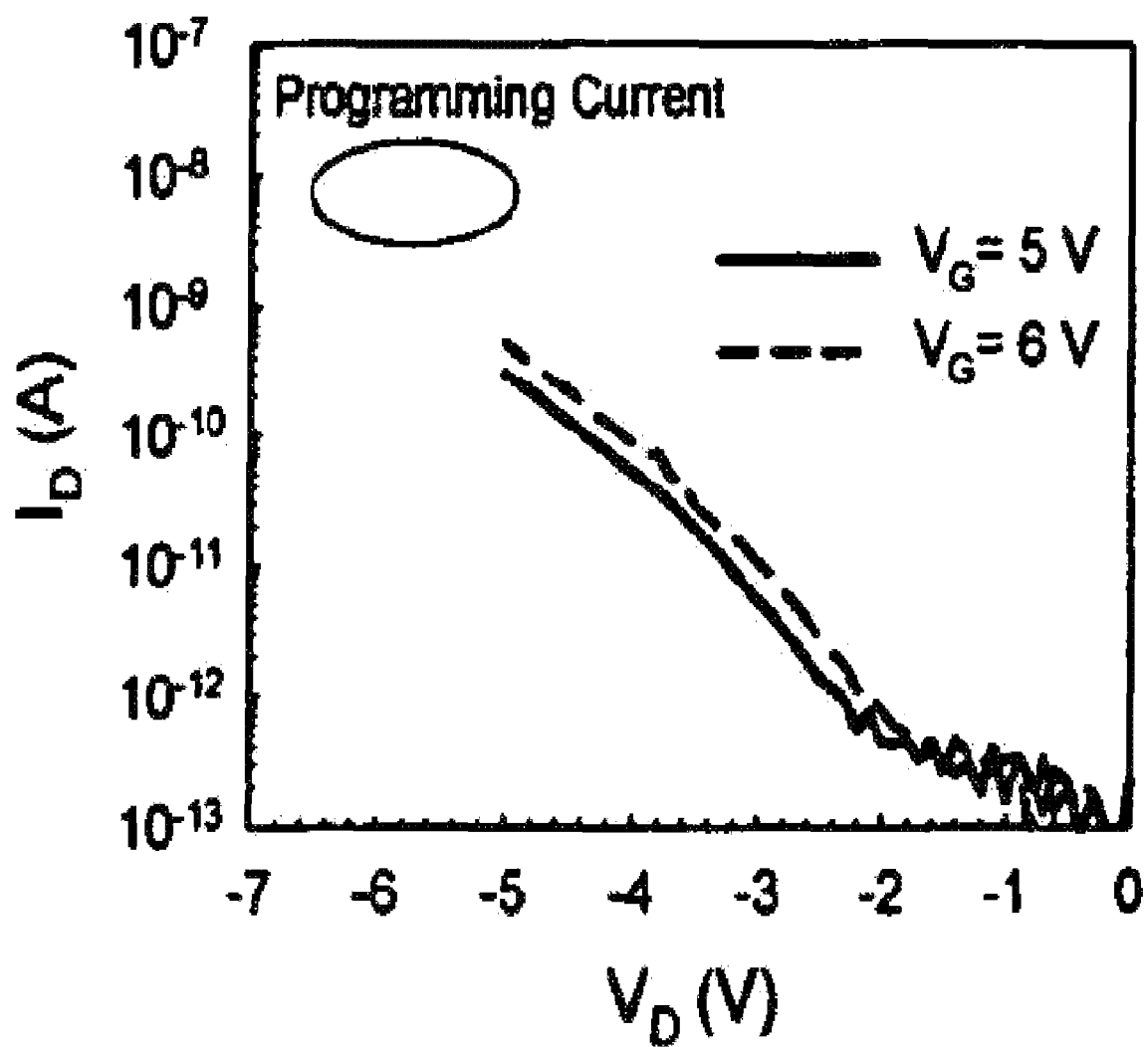
FIG. 19 is a graph of drain current as a function of gate voltage and drain voltage, with a BBHE programming current of about 10 nA.

FIG. 19 is a graph of drain current as a function of gate voltage and drain voltage, with a BBHE programming current of about 10 nA. The small programming current can easily pass through a NAND string. Moreover, this low-power programming allows for page programming techniques at high programming throughput.

Figure 20:
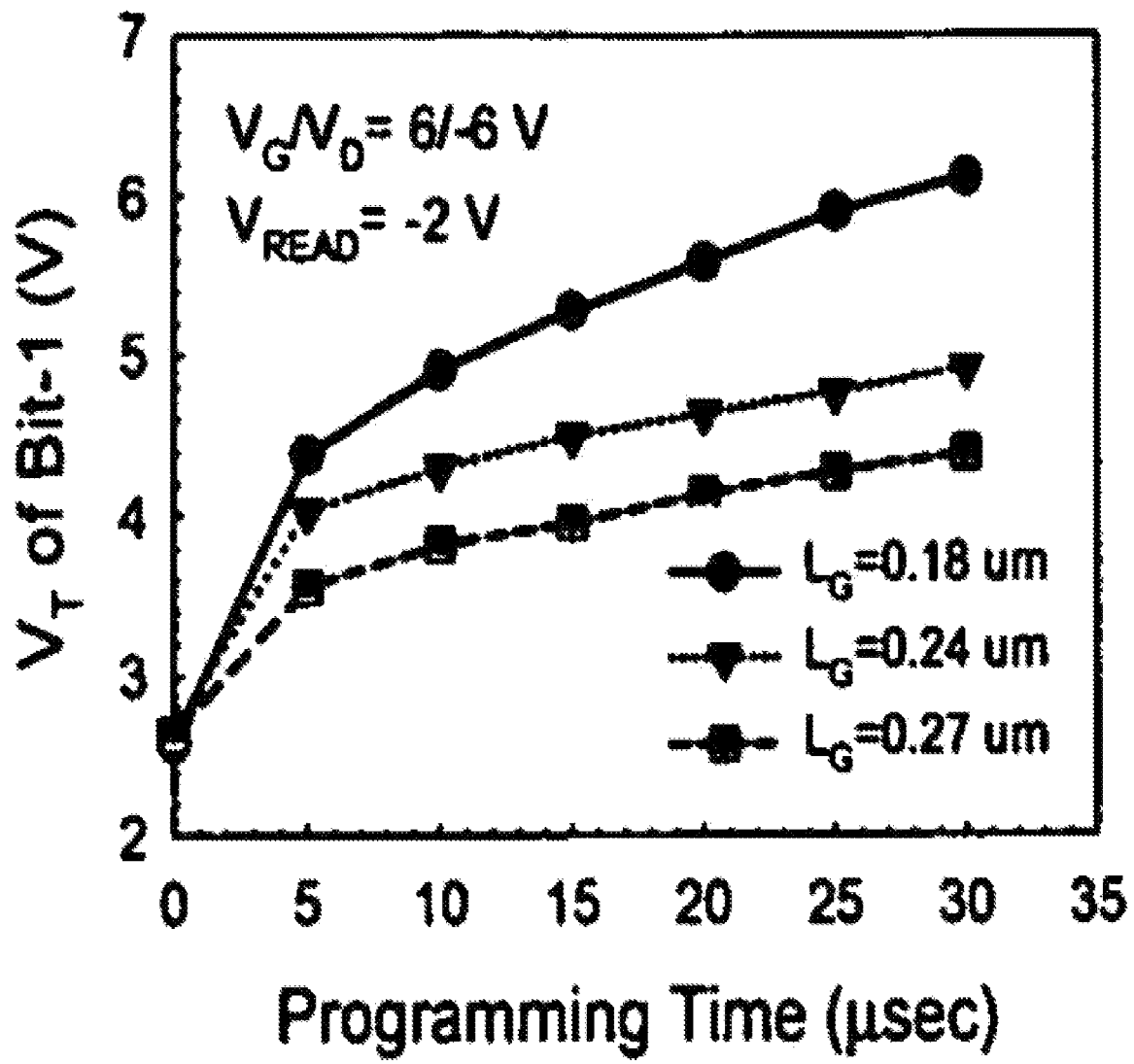
FIG. 20 is a graph of BBHE programming characteristics at various channel lengths.

FIG. 20 is a graph of BBHE programming characteristics for various channel lengths. As can be seen in the Figure, the programming speed is faster and the Vt is larger for a shorter channel length device.

Figure 21:
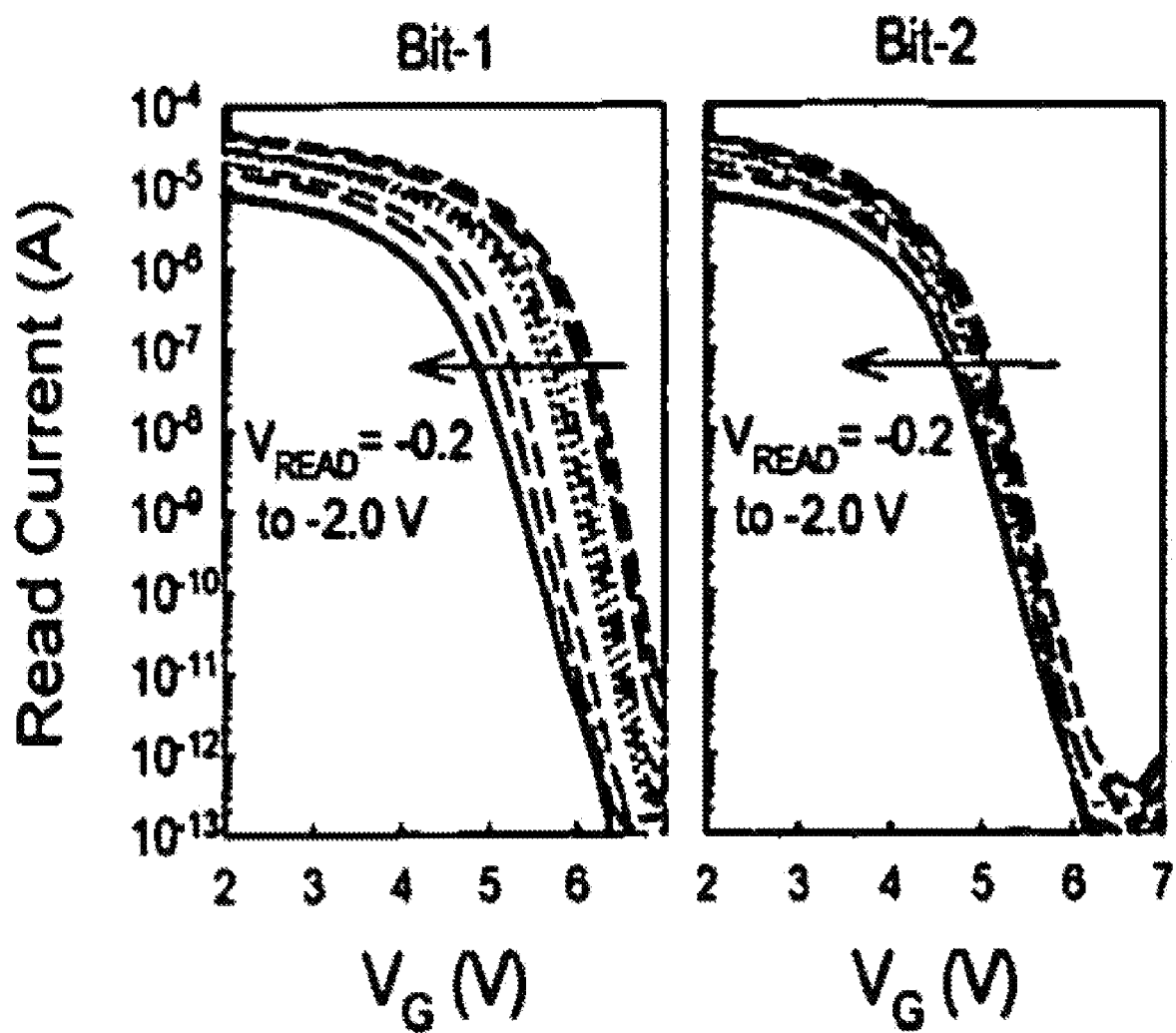
FIG. 21 is a graph of IV curves for Bit-1 (left graph) and Bit-2 (right graph) after Bit-1 is programmed.

FIG. 21 is a graph of IV curves for Bit-1 (left graph) and Bit-2 (right graph) after Bit-1 has been programmed. The Drain-Induced Barrier Lowering DIBL effect for Bit-1 and Bit-2 are different, which allows for a 2-bit/cell operation window. A larger magnitude $V_{read}$ results in a larger window between the two bits.

Figure 22:
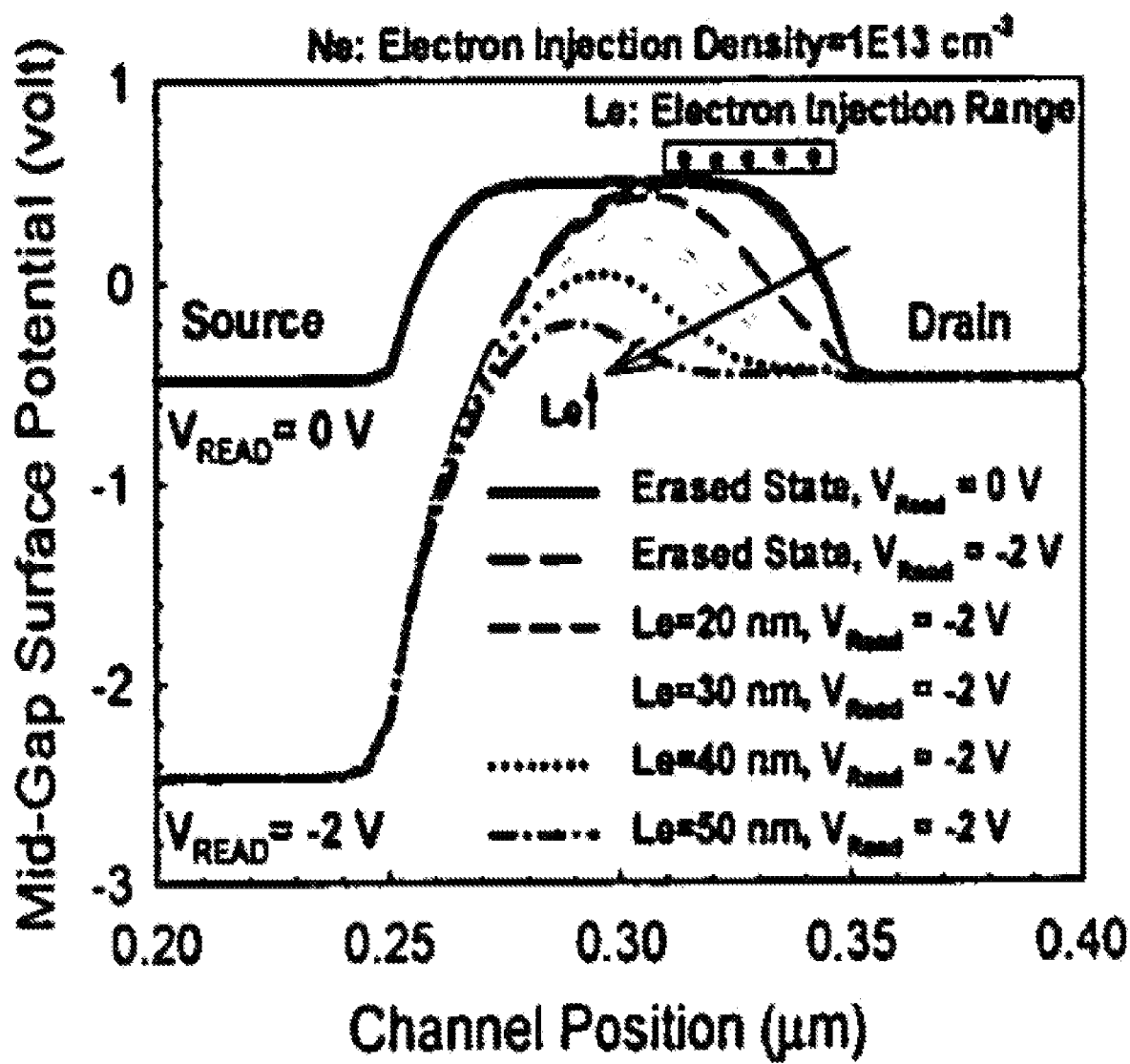
FIG. 22 is the simulated surface potential for the reverse read (reading Bit-1) after Bit-1 is programmed.

FIG. 22 is a simulated surface potential for the reverse read (reading Bit-1) after Bit-1 has been programmed. In the simulation the Electron Injection Density Ne is equal to 1 E cm$^{-2}$, and Vg-Vt is equal to +3V so the channel is cut-off. As can be seen in the Figure, the barrier lowering is enhanced by increasing the electron injection range Le.

Figure 23:
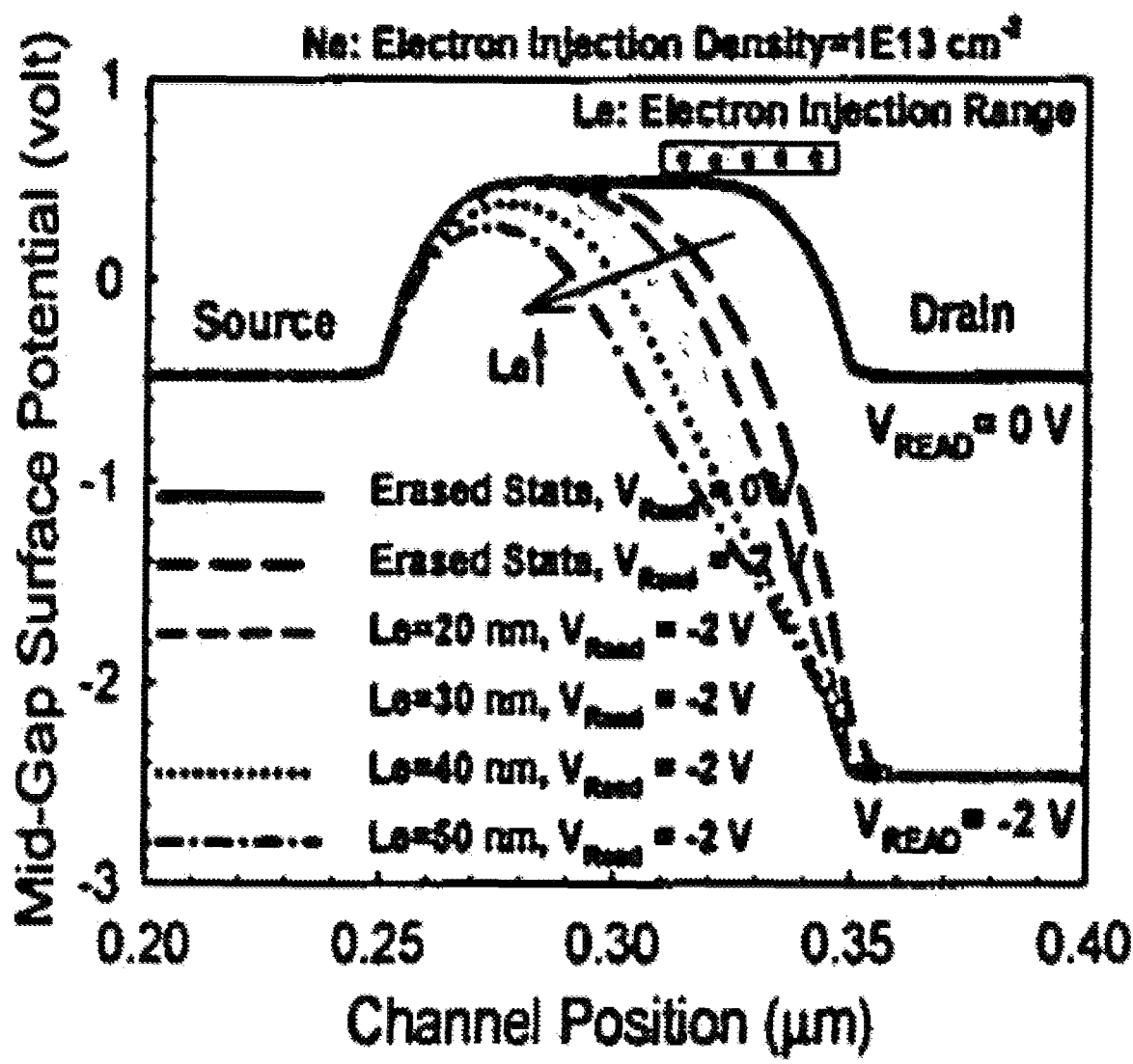
FIG. 23 is the simulated surface potential for the forward read (reading Bit-2) after Bit-1 is programmed.

FIG. 23 is a simulated surface potential for the forward read (reading Bit-2) after Bit-1 has been programmed. As can be seen, some barrier lowering occurs due to the DIBL effect, but this is smaller than with Bit-1 as shown in FIG. 22. This asymmetrical behavior between Bit-1 and Bit-2 creates a 2-bit/cell window.

Figure 24:
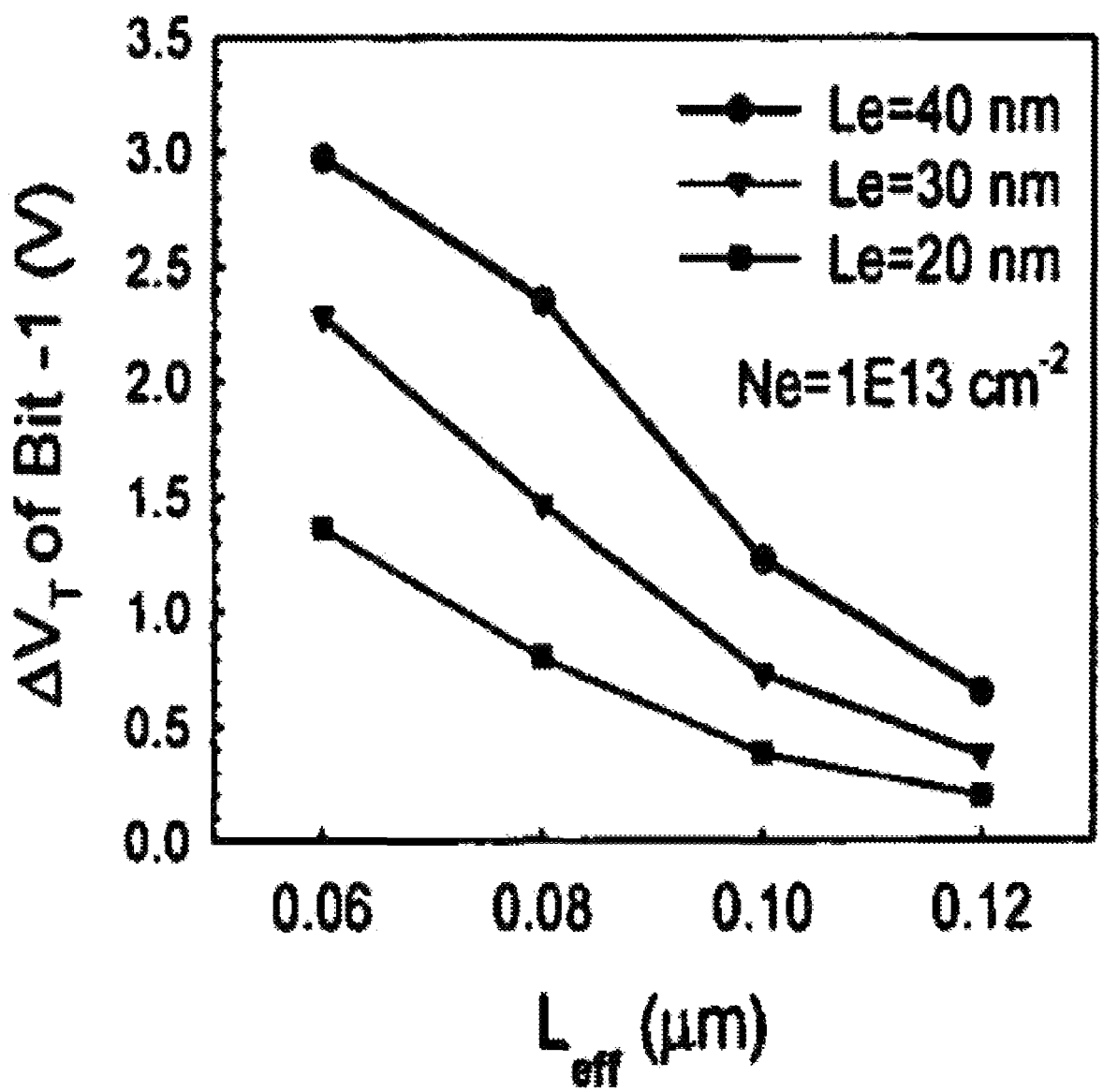
FIG. 24 is a simulation of the programmed Vt shift of Bit-1 for various effective channel lengths ($L_{eff}$).

FIG. 24 is a simulation of the programmed Vt shift of Bit-1 for various effected channel lengths Leff. A shorter channel length is beneficial in BBHE programming because the barrier lowering effect is more significant, which is consistent with FIG. 20.

Figure 25:
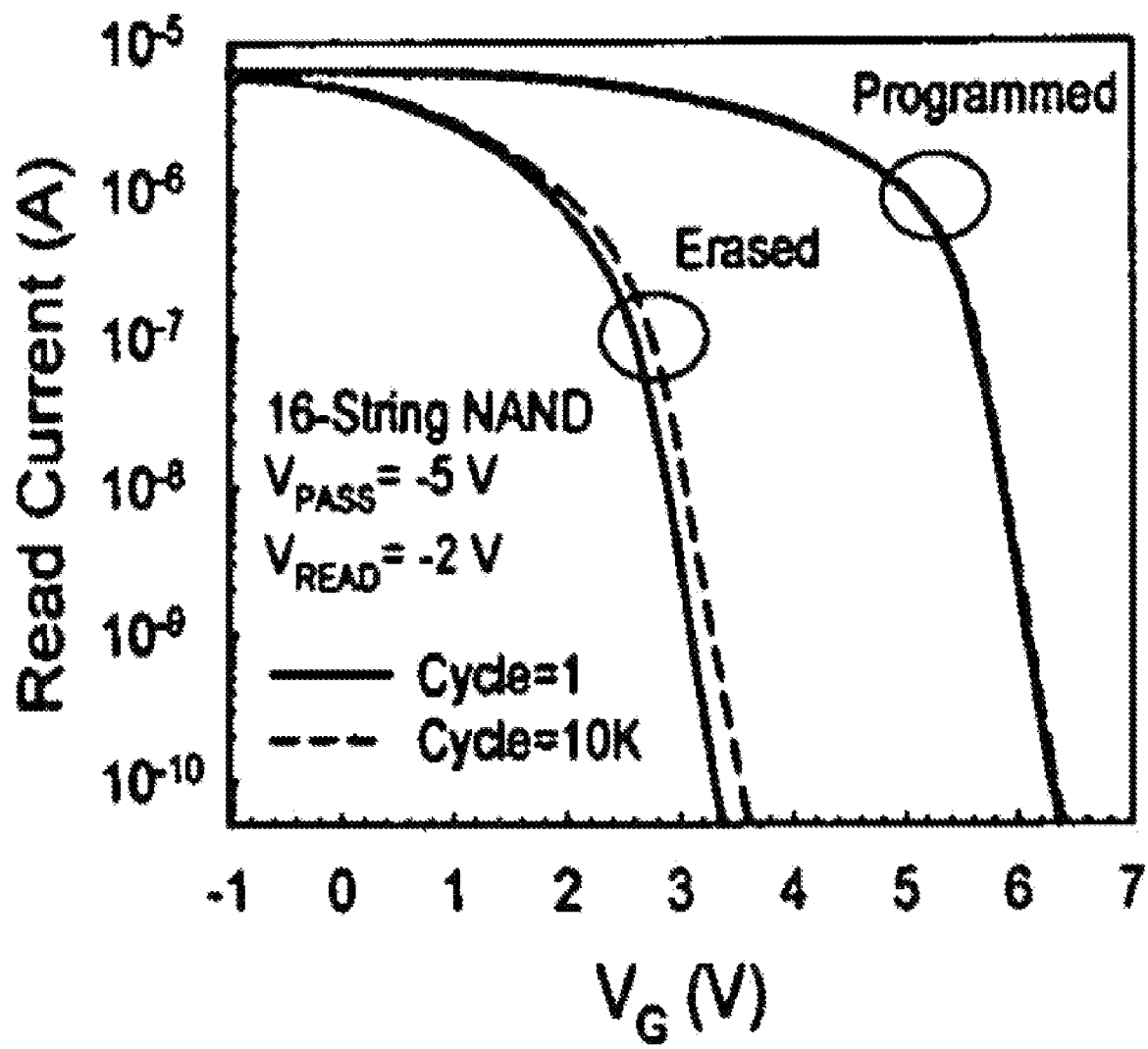
FIG. 25 is a graph of IV curves of the WL7 in a 16-string NAND during a 10K P/E cycle.

FIG. 25 shows the corresponding IV curves in a 16-string NAND during the 10K P/E cycle illustrated in FIG. 18. As can be seen from the Figures, only a small degradation in the IV curves is observed.

Figure 26:
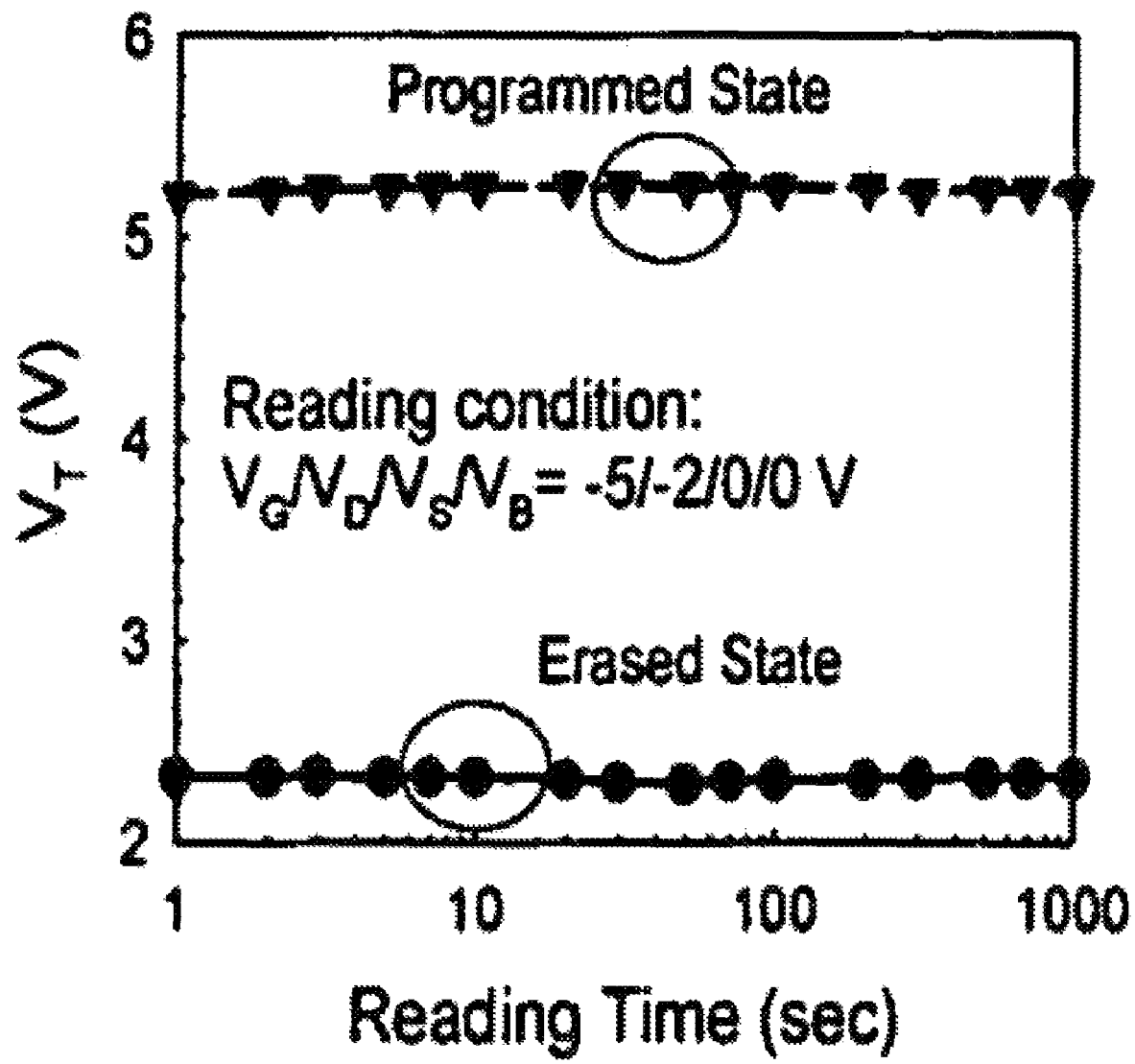
FIG. 26 is a graph of read disturb characteristics of a p-channel single cell.

FIG. 26 shows the read disturb characteristics of a p-channel single cell. Read disturb properties is important because the reverse read method requires a large read voltage. As can be seen in the Figure, read disturb is not observed even for a large gate overdrive and $V_{ds}$ is applied. This is because channel hot-hole (CHH) efficiency is negligible in the p-channel device.

Figure 27:
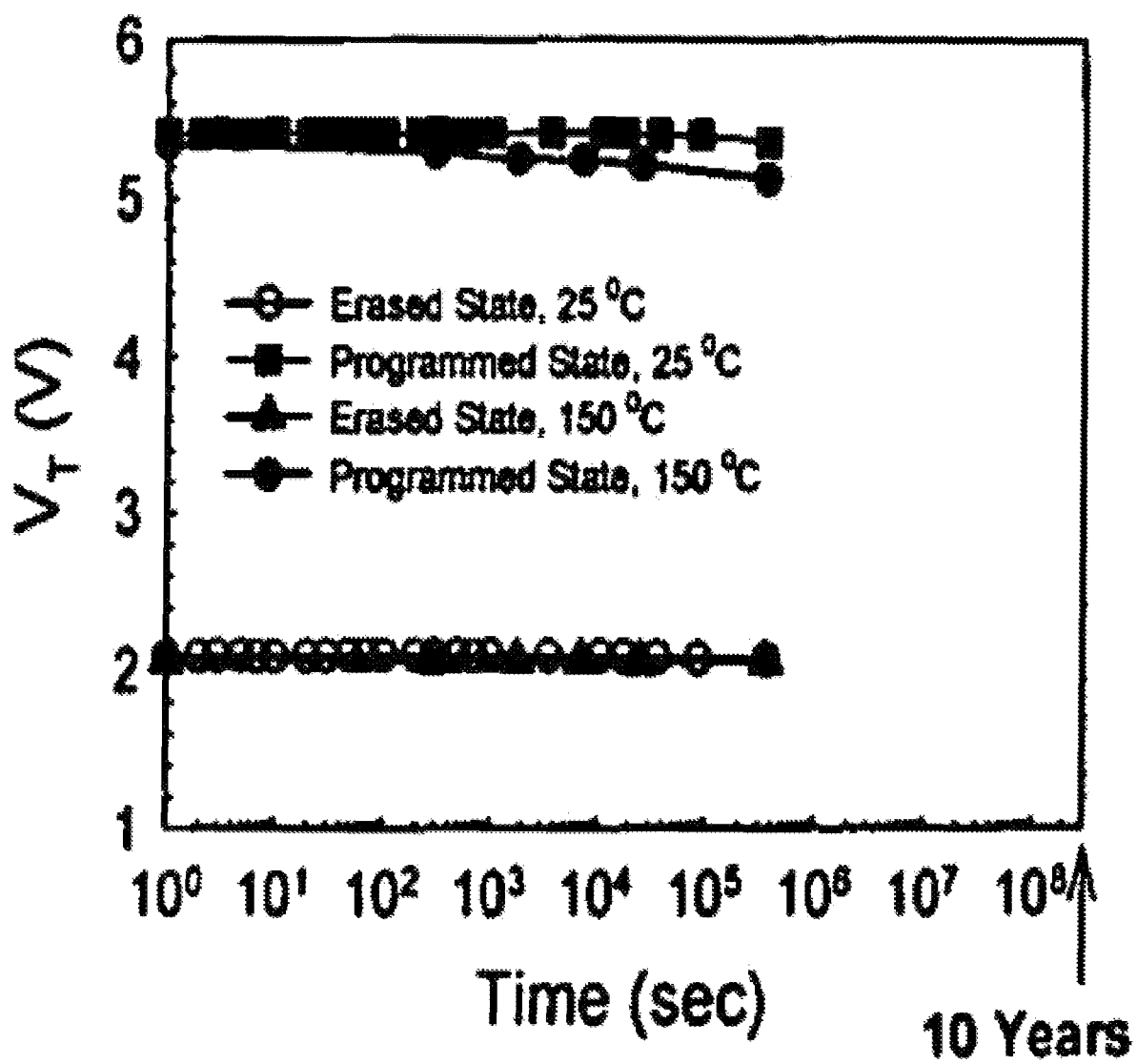
FIG. 27 is a graph of retention properties of a p-channel device after 10K P/E cycles.

FIG. 27 shows the retention properties of a p-channel device after 10K P/E cycles. As can be seen in the Figure, the device has excellent retention properties at both 25° C. and 150° C. The retention far surpasses conventional SONOS devices because the direct tunneling leakage is blocked by the O1/N1/O2 tunneling dielectric.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method comprising:
   (a) providing a memory cell comprising (i) an n-type substrate having two p-type source/drain regions disposed below a surface, the substrate and separated by a channel region, (ii) a multilayer tunneling dielectric structure disposed above the channel region, (iii) a charge-storage layer disposed above the multilayer tunneling dielectric structure, (iv) an insulating layer disposed above the charge-storage layer, and (v) a control gate disposed above the insulating layer; and
   (b) applying a positive bias to the control gate and a negative bias to one of the source/drain regions.

2. The method according to claim 1, wherein the multilayer tunneling dielectric structure comprises an oxide/nitride/oxide trilayer.

3. The method according to claim 1, wherein the multilayer tunneling dielectric structure comprises a silicon oxide/silicon nitride/silicon oxide trilayer.

4. The method according to claim 1, wherein the potential difference between the positive bias and the negative bias is at least about 10 volts.

5. The method according to claim 1, wherein the positive bias is about 5 to about 10 volts.

6. The method according to claim 1, wherein the negative bias is about −5 to about −10 volts.

7. A method of operating a memory device, wherein the memory device includes an n-type substrate and a plurality of memory cells formed thereon, each memory cell including a control gate, a source region, a drain region, a channel region defined between the source and drain regions, a charge-trapping layer provided above the channel region, a multilayer tunneling dielectric structure provided between the charge-trapping layer and the channel region, and an insulating layer provided between the charge-trapping layer and the control gate, wherein the control gate corresponds to a word line, the source region corresponds to a first bit line, and the drain region corresponds to a second bit line, and wherein each memory cell includes a first bit portion and a second bit portion, each for storing one bit of information, the method comprising:
   programming the first bit portion of the selected memory cell by applying a positive bias to the word line of the selected memory cell and applying a negative bias to the first bit line of the selected memory cell, such that electrons are injected into the charge-trapping layer.

8. The method according to claim 7, wherein the multilayer tunneling dielectric structure comprises an oxide/nitride/oxide trilayer.

9. The method according to claim 7, wherein the multilayer tunneling dielectric structure comprises a silicon oxide/silicon nitride/silicon oxide trilayer.

10. The method according to claim 7, wherein the potential difference between the positive bias and the negative bias is at least about 10 volts.

11. The method according to claim 7, wherein the positive bias is about 5 to about 10 volts.

12. The method according to claim 7, wherein the negative bias is about −5 to about −10 volts.

13. The method according to claim 7, further comprising:
   performing a reset operation prior to programming the first bit portion, wherein the reset operation comprises:
   (i) applying a negative bias to the word line of one or more selected memory cells, and
   (ii) applying a ground bias to the first bit line and the second bit line of the one or more selected memory cells, such that a dynamic balancing condition between hole injection and electron injection in the one or more selected memory cells occurs.

14. The method according to claim 7, further comprising:
   performing an erase operation subsequent to programming the first bit portion, wherein the erase operation comprises:
   (i) applying a negative bias to the word line of one or more selected memory cells, and
   (ii) applying a ground bias to the first bit line and the second bit line of the one or more selected memory cells.

15. A method of operating a memory device, wherein the memory device includes an n-type substrate and a plurality of memory cells formed thereon, each memory cell including a control gate, a source region, a drain region, a channel region defined between the source and drain regions, a charge-trapping layer provided above the channel region, a multi-layer tunneling dielectric layer provided between the charge-trapping layer and the channel region, and an insulating layer provided between the charge-trapping layer and the control gate, wherein the control gate corresponds to a word line, the source region corresponds to a first bit line, and the drain region corresponds to a second bit line, and wherein each memory cell includes a first bit portion and a second bit portion, each for storing one bit of information, the method comprising:

(a) resetting a selected memory cell, including;
 (i) applying a first negative bias to the word line of the selected memory cell, and
 (ii) applying a ground bias to both the first bit line and the second bit line, such that a dynamic balancing condition between hole injection and electron injection occurs; and
(b) programming the first bit portion of the selected memory cell, including;
 (i) applying a first positive bias to the word line of the selected memory cell,
 (ii) applying a second negative bias to the first bit line of the selected memory cell, such that electrons are injected into the charge-trapping layer, and
 (iii) floating the second bit line of the selected memory cell.

* * * * *

UNITED STATES PATENT AND TRADEMARK OFFICE
CERTIFICATE OF CORRECTION

PATENT NO. : 7,636,257 B2 Page 1 of 1
APPLICATION NO. : 11/417939
DATED : December 22, 2009
INVENTOR(S) : Hang-Ting Lue It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 902 days.

Signed and Sealed this

Ninth Day of November, 2010

David J. Kappos
*Director of the United States Patent and Trademark Office*